(12) United States Patent
Kim et al.

(10) Patent No.: US 10,916,648 B2
(45) Date of Patent: Feb. 9, 2021

(54) INTEGRATED CIRCUIT DEVICE

(71) Applicant: Samsung Electronics Co., Ltd., Suwon-si (KR)

(72) Inventors: Kwan-young Kim, Seoul (KR); Aliaksei Ivaniukovich, Yongin-si (KR); Hui-chul Shin, Uijeongbu-si (KR); Mi-jin Han, Gunpo-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 16 days.

(21) Appl. No.: 16/242,611

(22) Filed: Jan. 8, 2019

(65) Prior Publication Data
US 2019/0386134 A1 Dec. 19, 2019

(30) Foreign Application Priority Data
Jun. 19, 2018 (KR) .................. 10-2018-0070110

(51) Int. Cl.
| | | |
|---|---|---|
| *H01L 29/66* | (2006.01) | |
| *H01L 29/78* | (2006.01) | |
| *H01L 29/08* | (2006.01) | |
| *H01L 29/40* | (2006.01) | |
| *H01L 29/423* | (2006.01) | |

(52) U.S. Cl.
CPC ........ *H01L 29/7824* (2013.01); *H01L 29/086* (2013.01); *H01L 29/0878* (2013.01); *H01L 29/402* (2013.01); *H01L 29/42368* (2013.01); *H01L 29/66681* (2013.01)

(58) Field of Classification Search
CPC ............ H01L 27/1207; H01L 29/0653; H01L 29/0696; H01L 29/0847; H01L 29/086; H01L 29/0878; H01L 29/1045; H01L 29/402; H01L 29/42368; H01L 29/665; H01L 29/66659; H01L 29/66681; H01L 29/7824; H01L 29/7835
See application file for complete search history.

(56) References Cited

U.S. PATENT DOCUMENTS

| | | | |
|---|---|---|---|
| 8,994,115 B2 | 3/2015 | Korec | |
| 9,166,040 B2 | 10/2015 | Okawa | |
| 9,299,833 B2 | 3/2016 | Izumi | |
| 9,698,260 B1 * | 7/2017 | Zhang | ............... H01L 29/7825 |

(Continued)

FOREIGN PATENT DOCUMENTS

| | | |
|---|---|---|
| JP | 5983658 | 9/2016 |
| KR | 101505313 | 3/2015 |

*Primary Examiner* — Robert G Bachner
(74) *Attorney, Agent, or Firm* — Myers Bigel, P.A

(57) ABSTRACT

An integrated circuit device includes a bulk substrate including a first conductivity type well and a second conductivity type drift region, a stack pattern disposed on the bulk substrate and including a buried insulation pattern on the second conductivity type drift region and a semiconductor body pattern on the buried insulation pattern, a gate insulation layer on an upper surface of the first conductivity type well and on a sidewall and an upper surface of the stack pattern, and a gate electrode on the gate insulation layer. The gate electrode includes a first gate portion opposite to the first conductivity type well with the gate insulation layer therebetween and a second gate portion opposite to the second conductivity type drift region with the gate insulation layer and the stack pattern therebetween.

19 Claims, 23 Drawing Sheets

(56) References Cited

U.S. PATENT DOCUMENTS

| | | |
|---|---|---|
| 2006/0180862 A1 | 8/2006 | Nitta |
| 2007/0090451 A1 | 4/2007 | Lee |
| 2012/0132992 A1 | 5/2012 | Ding |
| 2014/0070314 A1 | 3/2014 | Shirakawa |
| 2014/0339636 A1* | 11/2014 | Hsu ..................... H01L 27/088 257/343 |
| 2015/0325697 A1 | 11/2015 | Toh |
| 2017/0358502 A1* | 12/2017 | Grenouillet ............ H01L 21/84 |

* cited by examiner

INTEGRATED CIRCUIT DEVICE

CROSS-REFERENCE TO RELATED APPLICATION

This application claims priority under 35 U.S.C. § 119 to Korean Patent Application No. 10-2018-0070110, filed on Jun. 19, 2018, in the Korean Intellectual Property Office, the disclosure of which is hereby incorporated by reference in its entirety.

BACKGROUND

Example embodiments of the present disclosure relate to integrated circuit devices and, more specifically, to integrated circuit devices including a lateral diffused metal oxide semiconductor transistor.

Recently, demand for power semiconductor devices has increased with the increase in the use of mobile devices, such as cellular phones, note books, and/or personal computers. In power semiconductor devices, when a breakdown voltage is increased to improve a high voltage characteristic, on-resistance may also be increased. Accordingly, a structure advantageous for optimization of the breakdown voltage and the on-resistance characteristic may be desired to secure an enlarged safe operating area (SOA) in the power semiconductor device.

SUMMARY

According to example embodiments of the inventive concept, a semiconductor device may include a bulk substrate, a first conductivity type well and a second conductivity type drift region in the bulk substrate, a stack pattern on the bulk substrate, wherein the stack pattern includes a buried insulation pattern on the second conductivity type drift region and a semiconductor body pattern on the buried insulation pattern, a gate insulation layer on an upper surface of the first conductivity type well and on a sidewall and an upper surface of the stack pattern, a gate electrode on the gate insulation layer, wherein the gate electrode includes a first gate portion opposite to the first conductivity type well with the gate insulation layer therebetween and a second gate portion opposite to the second conductivity type drift region with the gate insulation layer and the stack pattern therebetween, a source region in the first conductivity type well, and a drain region in the second conductivity type drift region.

According to example embodiments of the inventive concept, a semiconductor device may include a substrate, a first conductivity type well and a second conductivity type drift region in the substrate, a buried insulation pattern on the second conductivity type drift region, a field plate including a semiconductor body pattern on the buried insulation pattern, a gate insulation layer on the first conductivity type well and on the semiconductor body pattern, wherein the gate insulation layer includes an extension portion at least partially covering a sidewall of the semiconductor body pattern, a gate electrode on the gate insulation layer, wherein the gate electrode covers at least a portion of the first conductivity type well and at least a portion of the semiconductor body pattern and includes a step corresponding to the extension portion of the gate insulation layer, a source region in the first conductivity type well, and a drain region in the second conductivity type drift region.

According to example embodiments of the inventive concept, a semiconductor device may include a bulk substrate including a first region and a second region that are laterally spaced apart from each other, a buried insulation layer on the bulk substrate in the second region, a semiconductor body on the buried insulation layer in the second region, a first transistor including a first channel region in the bulk substrate in the first region, and a second transistor including a second channel region in the semiconductor body in the second region. The first transistor may include a first conductivity type well and a second conductivity type drift region in the bulk substrate in the first region, a buried insulation pattern on the second conductivity type drift region, a semiconductor body pattern on the buried insulation pattern, a first gate electrode at least partially covering the first conductivity type well, the buried insulation pattern, and the semiconductor body pattern. The buried insulation pattern may be at the same level relative to the bulk substrate as the buried insulation layer. The semiconductor body pattern may be at the same level relative to the bulk substrate as the semiconductor body.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

Figure 1A:
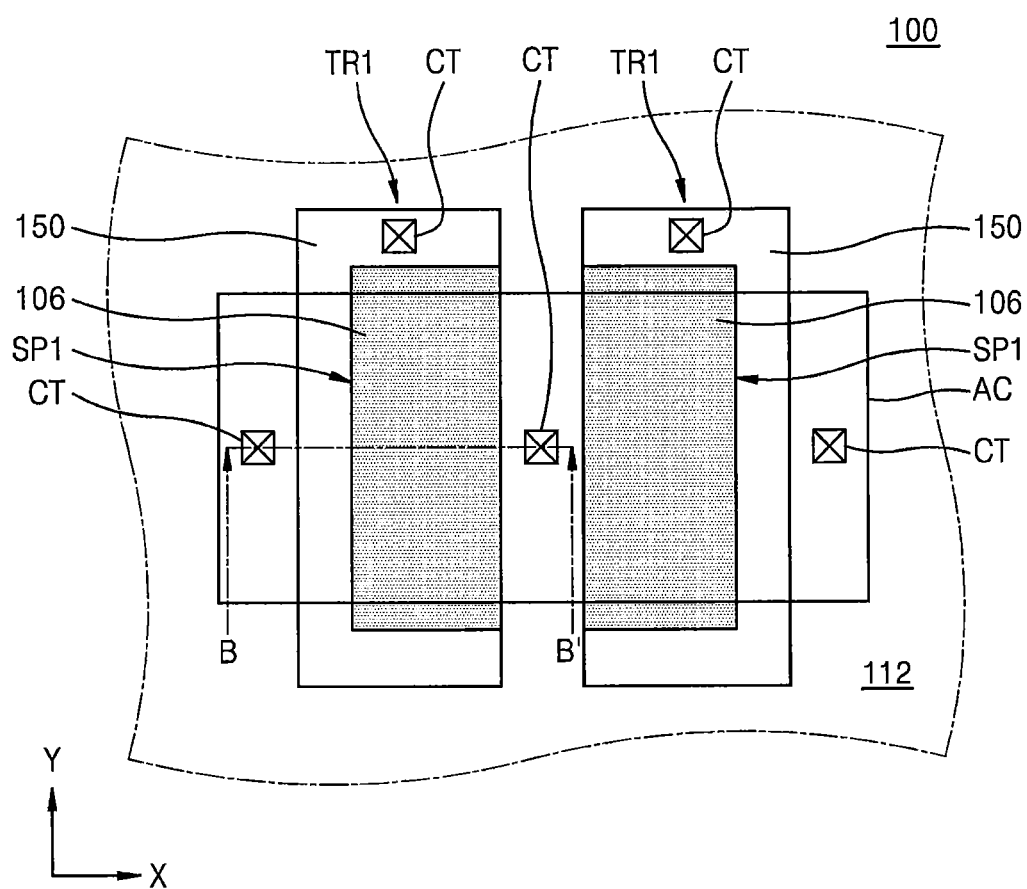
FIG. 1A is a plan view illustrating elements of an integrated circuit device according to example embodiments of the inventive concept.

Various example embodiments will now be described more fully hereinafter with reference to the accompanying drawings. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

As used herein, the term "MOS (metal-oxide-semiconductor)" may be a widely used term in a field of technology, and "M" may refer to various types of conductors, without being limited to just metal, and "S" may refer to a substrate or semiconductor structure. In addition, "O" may include various types of organic or inorganic materials without being limited to oxide. The term "semiconductor" may include, but is not limited to, a single crystalline semiconductor, a polycrystalline semiconductor, an amorphous semiconductor, a group IV semiconductor, and/or a compound semiconductor. Further, while a conductivity type or a doping region of components may be defined as "a P type" or "an N type" according to characteristics of a main carrier, this is merely for convenience of description, and the present inventive concept is not limited thereto. For example, the term "P type" or "N type" may be used as a more general term, "first conductive type" or "second conductive type." Here, the first conductive type may be a P type or an N type, and the second conductive type may be an N type or a P type.

In the following description, N-channel extended-drain MOS (EDMOS) transistors are used as example embodiments to describe integrated circuit devices according to the present inventive concept. However, this is for convenience of description, and the present inventive concept is not limited thereto. For example, by various modifications and changes within the scope of the present inventive concept, various integrated devices and circuits including P-channel EDMOS transistors, combination of P-channel EDMOS transistors and N-channel EDMOS transistors, N-channel lateral double-diffused MOS (LDMOS) transistors, P-channel LDMOS transistors, or combinations of P-channel LDMOS transistors and N-channel LDMOS transistors may be provided.

When manufacturing a hybrid semiconductor device, such as an input/output (I/O) device or radio frequency (RF) device, using a silicon on insulator (SOI) substrate in which relatively high operating voltage (Vdd) is used, a lateral diffused metal oxide semiconductor (LDMOS) structure may be formed. In the manufacturing process, a SOI and a buried oxide (BOX) may be completely removed and a shallow trench insulation (STI) embedded lateral diffused metal oxide semiconductor (STI-embedded LDMOS) transistor may be formed. The STI may enhance hot carrier injection (HCI), but the gate insulation layer may deteriorate due to a relatively high electric field at a gate edge. In addition, other device characteristics, such as off-state breakdown voltage (BVdss), off-state drain leakage (Idoff), cut-off frequency (Ft), and/or cell area may be degraded. Some embodiments of the present inventive concept stem from a realization that when the LDMOS structure or an extended-drain MOS (EDMOS) structure is formed, the SOI and the BOX may not be removed in their entireties and may be at least partially left on a drift region, such that a portion of a gate electrode overlaps a stack structure of the SOI and the BOX. The resulting structure may improve such characteristics as drain leakage, breakdown voltage, HCI, cell area, and cut-off frequency.

Figure 1B:
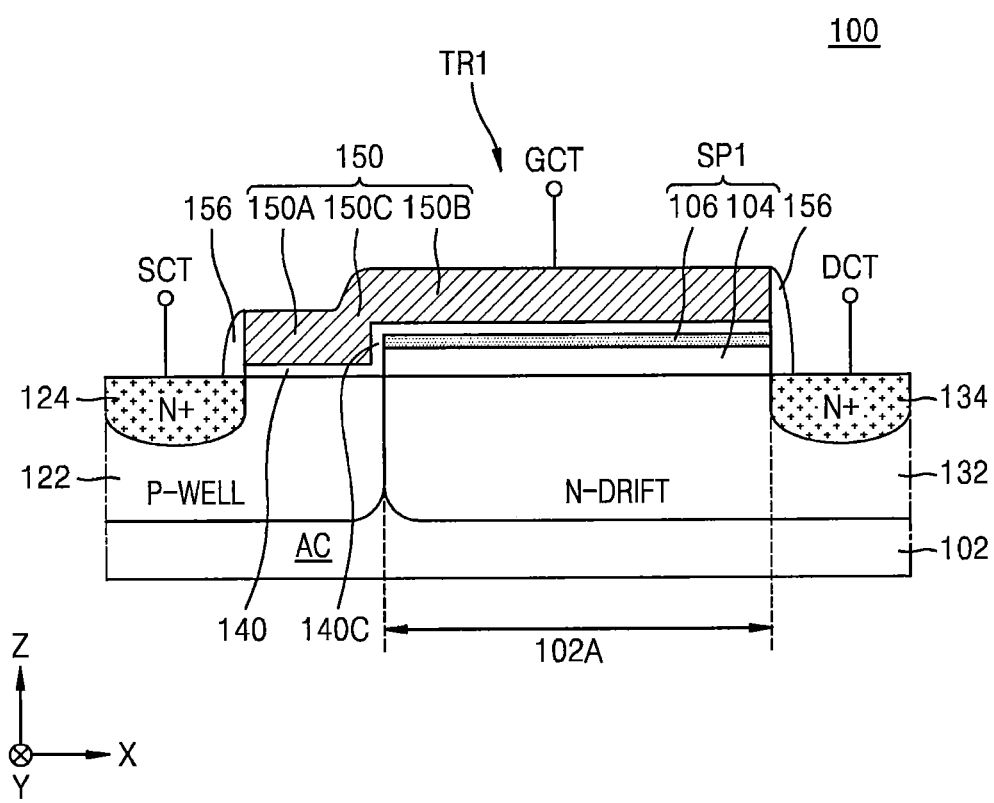
FIG. 1B is a cross-sectional view taken along line B-B' of FIG. 1A.

FIG. 1A is a plan view illustrating elements of an integrated circuit device according to example embodiments of the inventive concept. FIG. 1B is a cross-sectional view taken along line B-B' of FIG. 1A.

Referring to FIGS. 1A and 1B, an integrated circuit device 100 may include a bulk substrate 102 including an active region AC of a first conductivity type. The active region AC may be defined by an isolation region 112 formed in the bulk substrate 102. As used herein, the term "bulk substrate" means a substrate made of only semiconductor. In some embodiments, the bulk substrate 102 may include Si, Ge, SiGe, SiC, SiSn, PbS, GaAs, InP, GaP, GaN, and/or ZnS, but is not limited thereto. The isolation region 112 may include an oxide layer, a nitride layer, or combinations thereof.

The integrated circuit device 100 may include a plurality of EDMOS transistors TR1. A first conductivity type well 122 and a second conductivity type drift region 132 may be formed in the active region AC of the bulk substrate 102. As an example, the EDMOS transistor TR1 may include an N channel, the first conductivity type may be a P-type, and the second conductivity type may be an N type. The second conductivity type drift region 132 may include an N type doped region.

An upper surface of the first conductivity type well 122 and an upper surface of the second conductivity type drift region 132 may be generally flat along a horizontal direction (e.g., an X-Y plane direction). The first conductivity type well 122 and the second conductivity type drift region 132 may contact each other at an upper surface of the bulk substrate 102 or in the bulk substrate 102 adjacent thereto.

A stack pattern SP1 including a buried insulation pattern 104 and a semiconductor body pattern 106 may be formed on the bulk substrate 102. The stack pattern SP1 may extend in the horizontal direction. The buried insulation pattern 104 may contact the upper surface of the second conductivity type drift region 132 (or may be disposed on the second conductivity type drift region 132). The semiconductor body pattern 106 may contact the upper surface of the buried insulation pattern 104 (or may be disposed on the buried insulation pattern 104). In some embodiments, a planar shape of the buried insulation pattern 104 and a planar shape of the semiconductor body pattern 106 may be substantially the same. In some embodiments, the buried insulation pattern 104 may include a silicon oxide, and the semiconductor body pattern 106 may include silicon, but the present inventive concept is not limited thereto.

In the integrated circuit device 100, a portion of the bulk substrate 102 may constitute a semiconductor on insulator (SOI) region 102A along with the stack pattern SP1 covering the bulk substrate 102. As used herein, the term "SOI region" means a region having a structure in which the bulk substrate 102, the buried insulation pattern 104, and the semiconductor body pattern 106 are sequentially stacked. A portion of the second conductivity type drift region 132 covered by the stack pattern SP1 may constitute the SOI region 102A.

In the stack pattern SP1, a thickness of the buried insulation pattern 104 may be greater than a thickness of the semiconductor body pattern 106. For example, the buried insulation pattern 104 may have a thickness of 10 nm to 50 nm, and the semiconductor body pattern 106 may have a thickness of 5 nm to 20 nm.

A gate insulation layer 140 and a gate electrode 150 may be sequentially stacked on the bulk substrate 102. The gate insulation layer 140 and the gate electrode 150 may extend on the bulk substrate 102 to at least partially cover the first conductivity type well 122 and the stack pattern SP1.

The gate insulation layer 140 may include a portion contacting the upper surface of the first conductivity type well 122 and extending in the horizontal direction and another portion contacting an upper surface of the semiconductor body pattern 106 and extending in the horizontal direction. Further, the gate insulation layer 140 may include a vertical extension portion 140C contacting a sidewall of the stack pattern SP1 and extending in a vertical direction (e.g., a Z direction).

The gate electrode 150 may include a first gate portion 150A opposite to the upper surface of the first conductivity type well 122 with the gate insulation layer 140 therebetween and a second gate portion 150B opposite to the upper surface of the second conductivity type drift region 132 with the stack pattern SP1 and the gate insulation layer 140 therebetween. The second gate portion 150B may vertically overlap the buried insulation pattern 104 and the semiconductor body pattern 106 of the stack pattern SP1. The first gate portion 150A may not vertically overlap the buried insulation pattern 104 and the semiconductor body pattern 106. A channel region of the EDMOS transistor TR1 may be formed in a portion of the first conductivity type well 122 opposite to the first gate portion 150A.

The gate electrode 150 may further include a step portion 150C between the first gate portion 150A and the second gate portion 150B. The step portion 150C of the gate electrode 150 may correspond to the vertical extension portion 140C of the gate insulation layer 140. The first gate portion 150A, the second gate portion 150B, and the step portion 150C of the gate electrode 150 may be integrally coupled to each other so as to form a monolithic structure. The first gate portion 150A may be spaced apart from the bulk substrate 102 by a first distance corresponding to a thickness of the gate insulation layer 140, and the second gate portion 150B may be spaced apart from the bulk substrate 102 by a second distance greater than the first distance.

The gate insulation layer 140 may be interposed between the first conductivity type well 122 and the first gate portion 150A of the gate electrode 150 and between the semiconductor body pattern 106 and the second gate portion 150B of the gate electrode 150.

The gate electrode 150 may include conductive polysilicon, metal, conductive metal nitride, or combinations thereof. The metal may include Ti, Ta, W, Ru, Nb, Mo, and/or Hf, but is not limited thereto. The conductive metal nitride may include TiN, TaN, or a combination thereof, but is not limited thereto.

The gate insulation layer 140 may include silicon oxide, a high-k dielectric material, or a combination thereof. The high-k dielectric material may include metal oxide having a dielectric constant greater than that of silicon oxide. For example, the high-k dielectric material may include hafnium oxide, hafnium oxynitride, or hafnium silicon oxide, but is not limited thereto. In some embodiments, the gate insulation layer 140 may include a stack structure of a silicon oxide layer and a high-k dielectric layer.

A source region 124 may be disposed in the first conductivity type well 122. A drain region 134 may be disposed in the second conductivity type drift region 132. The drain region 134 may be laterally spaced apart from the first conductivity type well 122 with the second conductivity type drift region 132 therebetween. To implement the integrated circuit device 100 constituted by the N channel EDMOS, the second conductivity type drift region 132 may be formed of an N type doped region, and the source region 124 and the drain region 134 may be formed of an N+ type doped region having a higher doping concentration than the second conductivity type drift region 132. The source region 124 may be at least partially surrounded by the first conductivity type well 122. The drain region 134 may be at least partially surrounded by the second conductivity type drift region 132.

Sidewalls of the stack pattern SP1, the gate insulation layer 140, and the gate electrode 150 toward the drain region 134 may be aligned with a vertical line extending from any point on the bulk substrate 102, such that the sidewalls of the stack pattern SP1, the gate insulation layer 140, and the gate electrode 150 toward the drain region 134 may extend on a plane (e.g., a Y-Z plane).

The sidewalls of the gate insulation layer 140 and the gate electrode 150 may be at least partially covered by an insulation spacer 156. In the insulation spacer 156, a height of a first part covering a sidewall of the first gate portion 150A over the first conductivity type well 122 may be less than a height of a second part covering a sidewall of the second gate portion 150B over the second conductivity type drift region 132. The second part of the insulation spacer 156 covering the sidewall of the second gate portion 150B may also at least partially cover the sidewall of the stack pattern SP1, between the gate electrode 150 and the drain region 134.

The drain region 134 may be formed at a location self-aligned with the insulation spacer 156 in the bulk substrate 102. The insulation spacer 156 may include an oxide layer, a nitride layer, or a combination thereof.

The gate electrode 150 may be connected to a gate contact terminal GCT. The source region 124 may be connected to a source contact terminal SCT. The drain region 134 may be connected to a drain contact terminal DCT.

As shown in FIG. 1A, a plurality of contacts CT including the gate contact terminal GCT, the source contact terminal SCT, and the drain contact terminal DCT may be disposed in an integrated circuit device 100. A location of each of the plurality of contacts CT may be variously changed without being limited to that shown in FIG. 1A in various embodiments of the inventive concept.

The integrated circuit device 100 shown in FIGS. 1A and 1B may include the stack pattern SP1 disposed on a portion of the second conductivity type drift region 132 and including the buried insulation pattern 104 and the semiconductor body pattern 106. The stack pattern SP1 may constitute the SOI region 102A along with the portion of the bulk substrate 102. In the EDMOS transistor of the integrated circuit device 100, a relatively large distance may be maintained between the gate electrode 150 and the second conductivity type drift region 132 by a relatively thick buried insulation pattern 104, such that a vertical electrical field in the gate electrode 150 may be reduced. Thus, hot carrier injection (HCI) and gate-to-drain overlap capacitance (Cgd) may be reduced or minimized, leakage current in an off-state may be suppressed, and an improved cutoff frequency ($f_T$) characteristic may be achieved.

In addition, a relatively wide area of the second conductivity type drift region 132 below the buried insulation pattern 104 may be used for current conduction. Thus, a current path may be relatively shortened compared to a general case using a trench insulation region formed in the bulk substrate 102 instead of the buried insulation pattern 104. Due to such a shortened current path, on-resistance (Ron) formed between the gate electrode 150 and the drain region 134 in the second conductivity type drift region 132 may be reduced, thus improving maximum current driving performance and maximum transconductance (Gm). Accordingly, in the integrated circuit device 100, a boundary of a safe operating area (SOA) representing a limitation of source-drain current and source-drain voltage at which the integrated circuit device 100 may be stably or reliably operated without electrical degradation or malfunction may be expanded, and electrical performance may be enhanced. Further, the integrated circuit device 100 may provide a structure advantageous for reducing an occupied area of one EDMOS transistor TR1, such that a highly scaled and integrated circuit device may be implemented.

Figure 2:
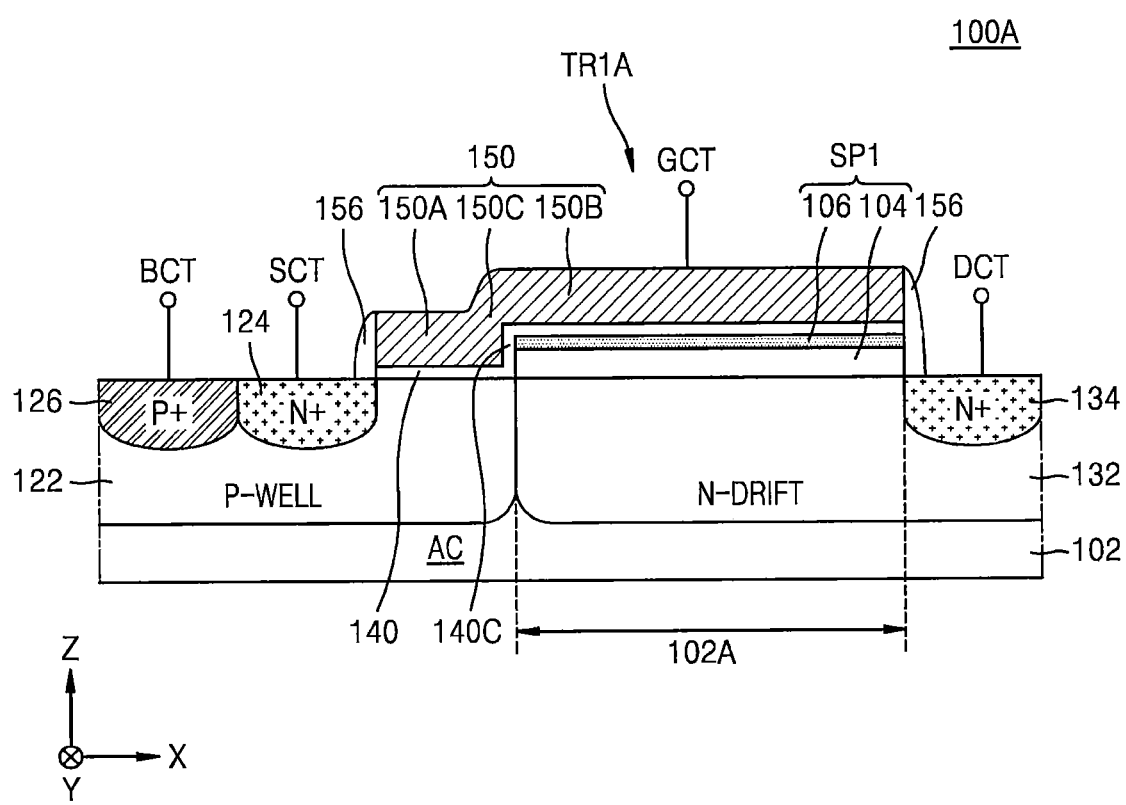
FIGS. 2 to 7 are cross-sectional views illustrating an integrated circuit device according to example embodiments of the inventive concept.

FIG. 2 is a cross-sectional view illustrating an integrated circuit device according to example embodiments of the inventive concept. The same reference numerals are used to denote the same elements as shown in FIGS. 1A and 1B, and thus detailed descriptions thereof will be omitted.

Referring to FIG. 2, an integrated circuit device 100A may have the same configuration or structure as the integrated circuit device 100 described with reference to FIGS. 1A and 1B. However, an EDMOS transistor TR1A of the integrated circuit device 100A may further include body contact region 126 of first conductivity type in the first conductivity type well 122.

The body contact region 126 and the source region 124 may be formed in the first conductivity type well 122 to contact each other. The body contact region 126 may have a doping concentration higher than a doping concentration of the first conductivity type well 122. The body contact region 126 may be formed of a P+ type doping region.

A body contact terminal BCT may be connected to the body contact region 126. In some embodiments, the body contact terminal BCT connected to the body contact region 126 may be omitted. In some embodiments, the body contact region 126 may be formed of an electrically floating well region.

Figure 3:
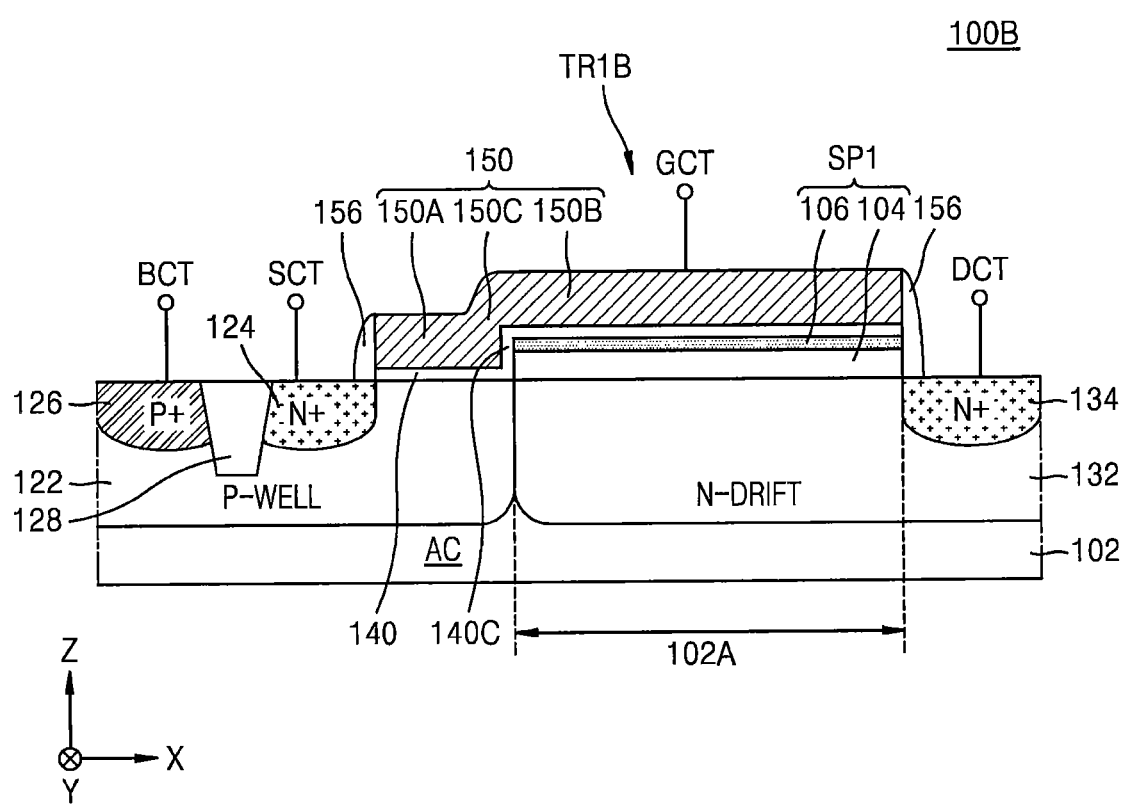

FIG. 3 is a cross-sectional view illustrating an integrated circuit device according to example embodiments of the inventive concept. The same reference numerals are used to denote the same elements as shown in FIGS. 1A, 1B, and 2, and thus detailed descriptions thereof will be omitted.

Referring to FIG. 3, an integrated circuit device 100B may have generally the same configuration or structure as the integrated circuit device 100 described with reference to FIGS. 1A and 1B. However, an EDMOS transistor TR1B of the integrated circuit device 100B may further include the body contact region 126 of first conductivity type and a source field insulation layer 128 in the first conductivity type well 122. The source region 124 and the body contact region 126 may be spaced apart from each other with the source field insulation layer 128 therebetween. In the integrated circuit device 100B, the body contact terminal BCT connected to the body contact region 126 may be omitted.

Figure 4:
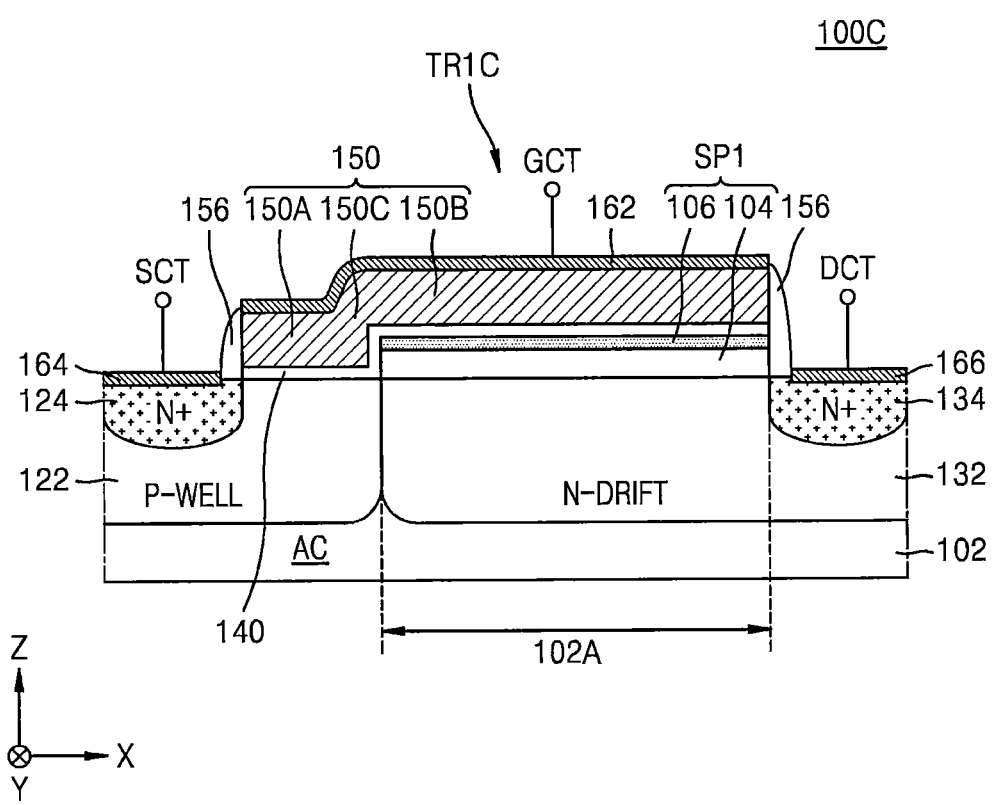

FIG. 4 is a cross-sectional view illustrating an integrated circuit device according to example embodiments of the inventive concept. The same reference numerals are used to denote the same elements as shown in FIGS. 1A, and 1B, and thus detailed descriptions thereof will be omitted.

Referring to FIG. 4, an integrated circuit device 100C may have generally the same configuration or structure as the integrated circuit device 100 described with reference to FIGS. 1A and 1B. However, an EDMOS transistor TR1C of the integrated circuit device 100C may further include a first metal silicide layer 162 at least partially covering an upper surface of the gate electrode 150, a second metal silicide layer 164 at least partially covering an upper surface of the source region 124, and a third metal silicide layer 166 at least partially covering an upper surface of the drain region 134. In some embodiments, the first to third metal silicide layers 162, 164, and 166 may include nickel silicide, titanium silicide, or aluminum silicide, but are not limited thereto.

Figure 5:
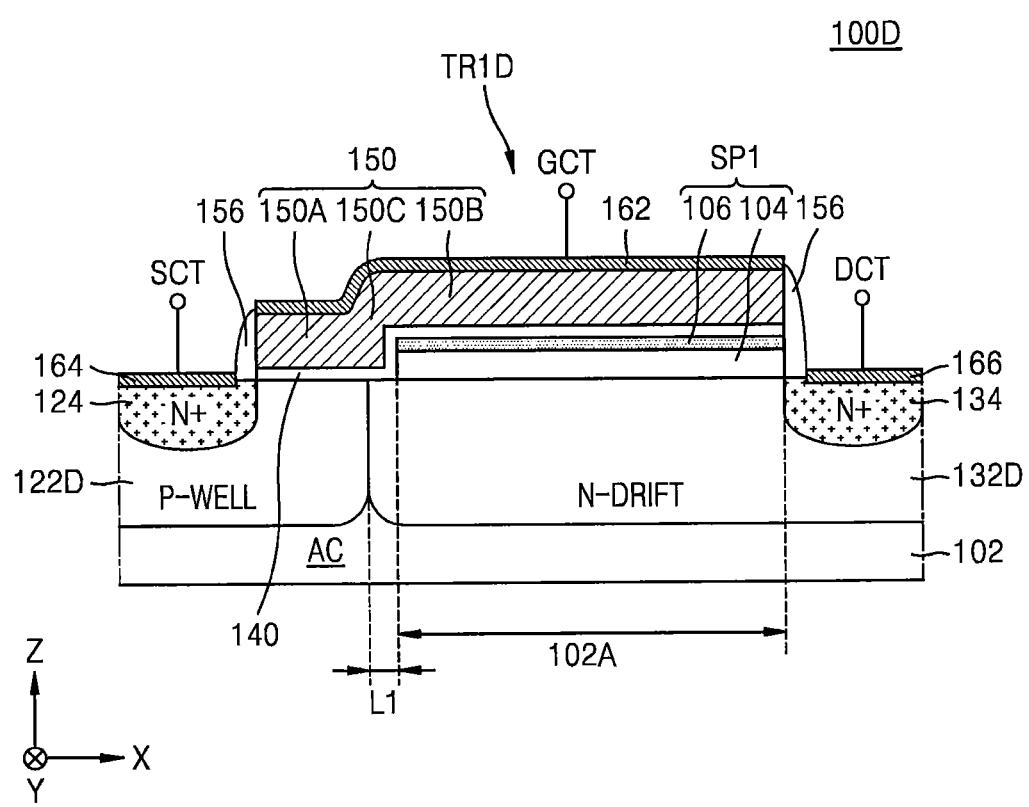

FIG. 5 is a cross-sectional view illustrating an integrated circuit device according to example embodiments of the inventive concept. The same reference numerals are used to denote the same elements as shown in FIG. 4, and thus detailed descriptions thereof will be omitted.

Referring to FIG. 5, an integrated circuit device 100D may have generally the same configuration or structure as the integrated circuit device 100C described with reference to FIG. 4. However, an EDMOS transistor TR1D of the integrated circuit device 100D may include a first conductivity type well 122D and a second conductivity type drift region 132D in the active region AC of the bulk substrate 102. The first conductivity type well 122D and the second conductivity type drift region 132D may contact each other at the upper surface of the bulk substrate 102 and in the bulk substrate 102 adjacent thereto. A region in which the first conductivity type well 122D and the second conductivity type drift region 132D contact each other at the upper surface of the bulk substrate 102 may be located below the first gate portion 150A of the gate electrode 150. The first conductivity type well 122D may be positioned at a location spaced a first distance L1 apart from one end of the stack pattern SP1 along the horizontal direction (e.g., X direction) in a direction farther away from the drain region 134. The second conductivity type drift region 132D may be disposed below the stack pattern SP1 and may further extend by the first distance L1 from the one end of the stack pattern SP1 along the horizontal direction in the direction farther away from the drain region 134. The first gate portion 150A may include a portion opposite to an upper surface of the second conductivity type drift region 132D.

Figure 6:
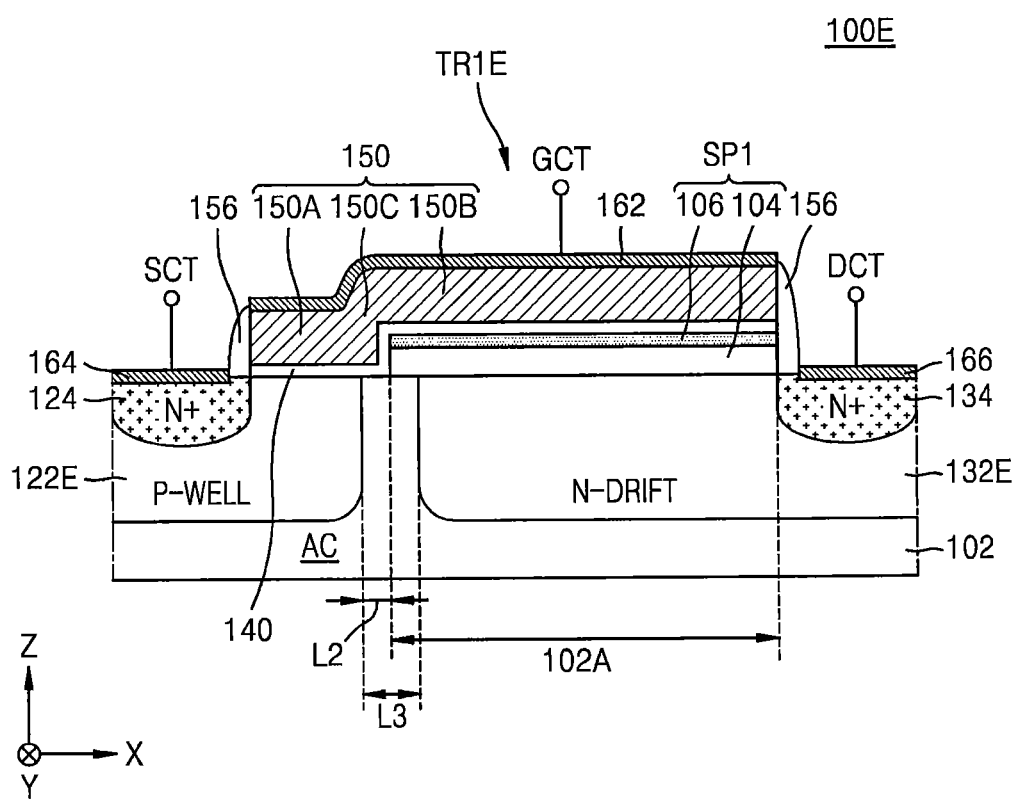

FIG. 6 is a cross-sectional view illustrating an integrated circuit device according to example embodiments of the inventive concept. The same reference numerals are used to denote the same elements as shown in FIG. 4, and thus detailed descriptions thereof will be omitted.

Referring to FIG. 6, an integrated circuit device 100E may have generally the same configuration or structure as the integrated circuit device 100C described with reference to FIG. 4. However, an EDMOS transistor TR1E of the integrated circuit device 100E may include a first conductivity type well 122E and a second conductivity type drift region 132E in the active region AC of the bulk substrate 102. The first conductivity type well 122E and the second conductivity type drift region 132E may have structures similar to the first conductivity type well 122 and the second conductivity type drift region 132 described with reference to FIG. 4. However, the first conductivity type well 122E and the second conductivity type drift region 132E may be spaced apart from each other.

The first conductivity type well 122E may be disposed at a location spaced a second distance L2 apart from one end of the stack pattern SP1 along the horizontal direction in a direction farther away from the drain region 134. A spaced distance L3 between the first conductivity type well 122E and the second conductivity type drift region 132E may be greater than the second distance L2. An end portion of the second conductivity type drift region 132E closest to the source region 124 may be located below the stack pattern SP1. Thus, a distance in the horizontal direction from the source region 124 to the second conductivity type drift region 132E may be less than a distance in the horizontal direction from the source region 124 to the stack pattern SP1.

The HCI may be reduced as the end portion of the second conductivity type drift region 132E closest to the source region 124 approaches the drain region 134. However, the on-resistance may be increased. Thus, the spaced distance L3 between the first conductivity type well 122E and the second conductivity type drift region 132E may be determined to improve or optimize the breakdown voltage and the on-resistance characteristic based on desired electrical characteristics.

Figure 7:
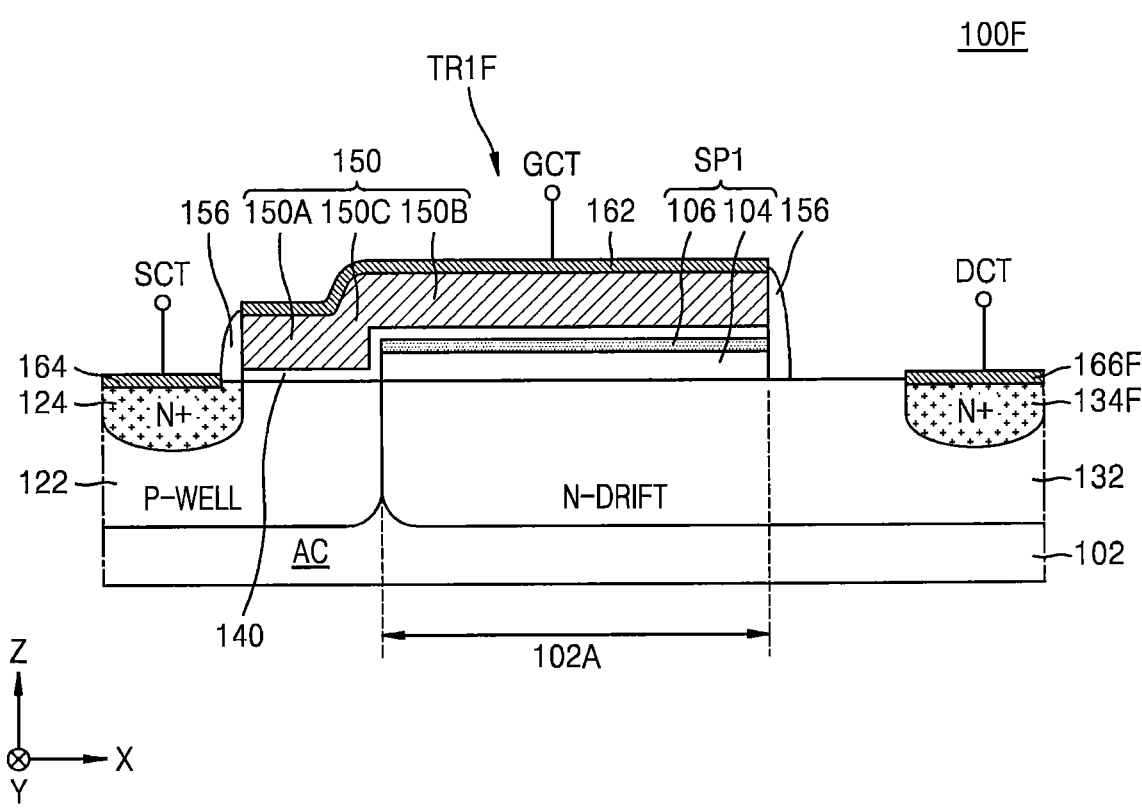

FIG. 7 is a cross-sectional view illustrating an integrated circuit device according to example embodiments of the inventive concept. The same reference numerals are used to denote the same elements as shown in FIG. 4, and thus detailed descriptions thereof will be omitted.

Referring to FIG. 7, an integrated circuit device 100F may have generally the same configuration or structure as the integrated circuit device 100C described with reference to FIG. 4. However, in an EDMOS transistor TR1F of the integrated circuit device 100F, a drain region 134F may be disposed at a location spaced apart from the stack pattern SP1 in the horizontal direction, and a portion of the second conductivity type drift region 132 may be disposed between the stack pattern SP1 and the drain region 134F.

The drain region 134F may be spaced apart from the insulation spacer 156 at least partially covering the sidewall of the gate electrode 150 and the sidewall of the stack pattern SP1. An upper surface of the drain region 134F may be at least partially covered by a third metal silicide layer 166F. The third metal silicide layer 166F may include nickel silicide, titanium silicide, and/or aluminum silicide.

In the integrated circuit device 100F of FIG. 7, a drift length may be increased due to the second conductivity type drift region 132 having an increasing length in the horizontal direction between the gate electrode 150 and the drain region 134F, such that the current path in the second conductivity type drift region 132 may become relatively long. As the drain region 134F is farther away from the stack pattern SP1 and the source region 124, increase of the on-resistance may be suppressed. Thus, the breakdown voltage and the on-resistance characteristic may be improved or optimized by maintaining an improved or optimal distance between the gate electrode 150 and the drain region 134F as needed.

In the integrated circuit devices 100C, 100D, 100E, and 100F described with reference to FIGS. 4 to 7, a width of the second conductivity type drift regions 132, 132D, and 132E and/or a distance between the stack pattern SP1 and the drain regions 134 and 134F may be adjusted to provide an integrated circuit device having an improved or optimum electrical performance in consideration of a trade-off relationship based on the electrical characteristics, such as the breakdown voltage, the leakage current, the gate-gate overlap capacitance, the on-resistance, the HCI, or the like. In addition, as a result, integrated circuit devices of various structures having variously modified and changed structures within the scope of the present inventive concept may be obtained.

Figure 8A:
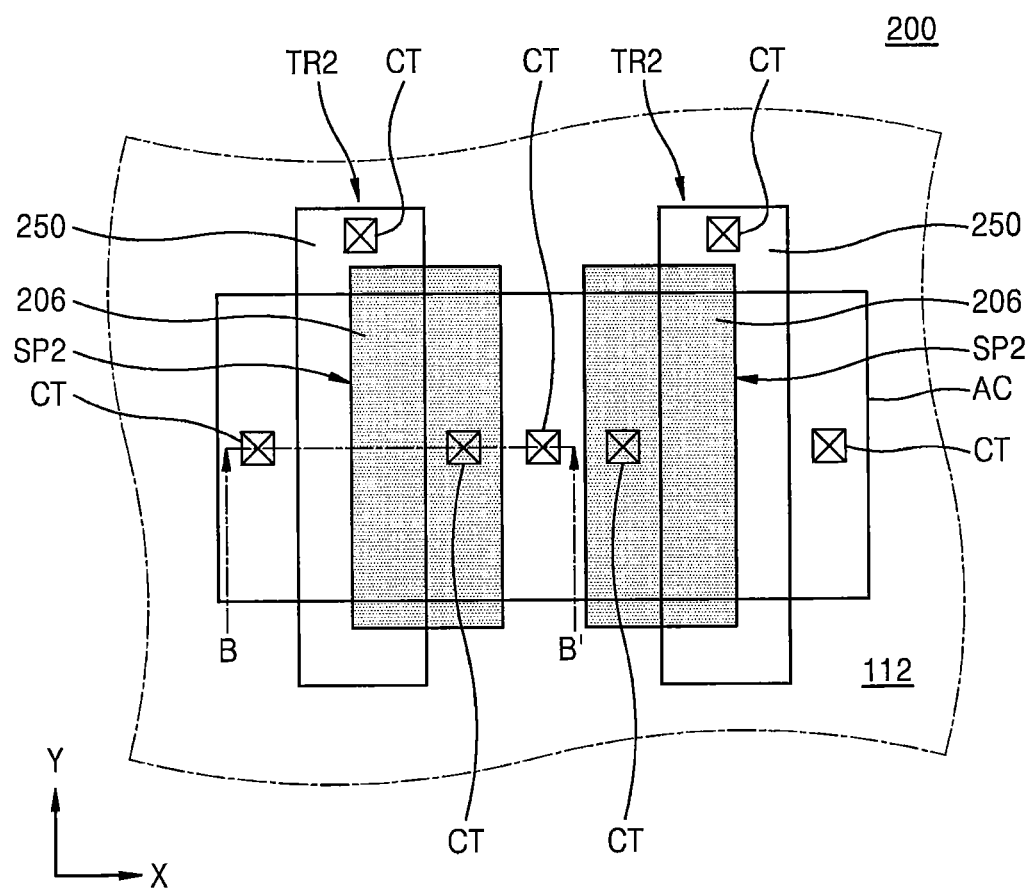
FIG. 8A is a plan view illustrating elements of an integrated circuit device according to further example embodiments of the inventive concept.
Figure 8B:
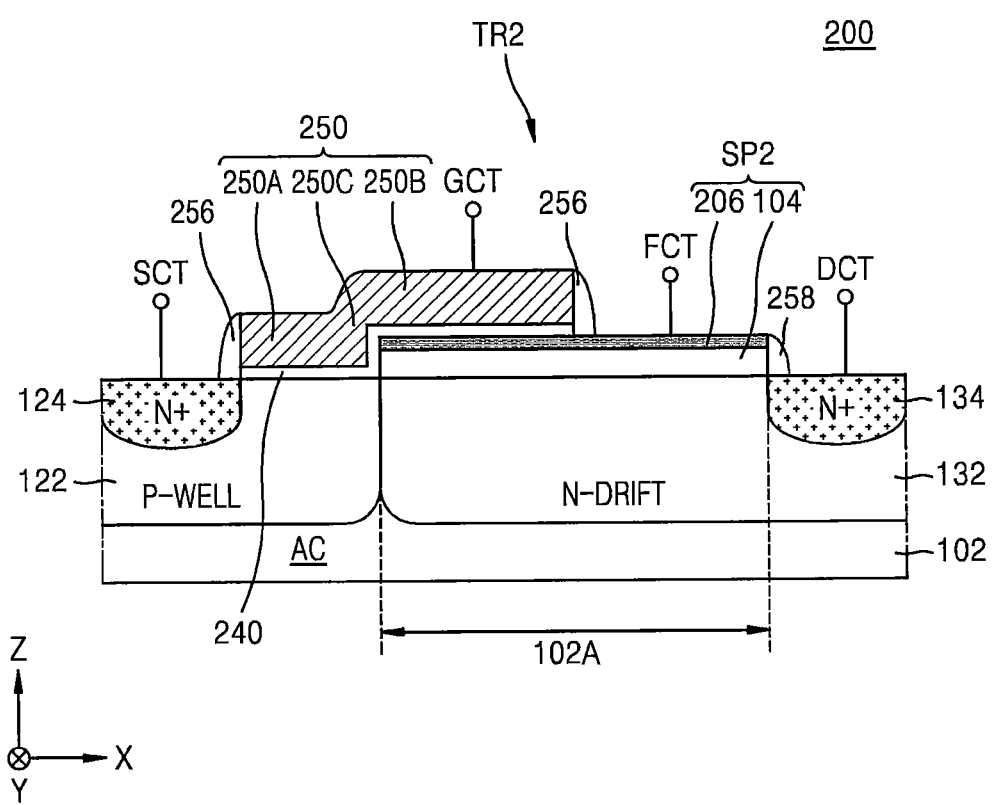
FIG. 8B is a cross-sectional view taken along line B-B' of FIG. 8A.

FIGS. 8A and 8B are views illustrating an integrated circuit device according to further example embodiments of the inventive concept. FIG. 8A is a plan view illustrating main elements of an integrated circuit device according to example embodiments. FIG. 8B is a cross-sectional view taken along line B-B' of FIG. 8A. The same reference numerals are used to denote the same elements as in shown in FIGS. 1A and 1B, and thus detailed descriptions thereof will be omitted.

Referring to FIGS. 8A and 8B, the integrated circuit device 200 may have generally the same configuration or structure as the integrated circuit device 100 described with reference to FIGS. 1A and 1B. The integrated circuit device 200 may include a plurality of EDMOS transistors TR2. The EDMOS transistor TR2 may include a stack pattern SP2 on the bulk substrate 102. The stack pattern SP2 may include the buried insulation pattern 104 and a semiconductor body pattern 206 formed of a conductive layer. In some embodiments, the semiconductor body pattern 206 may be formed of silicon doped with second conductivity type impurities. In the stack pattern SP2, a planar shape of the buried insulation pattern 104 may be substantially the same as a planar shape of the semiconductor body pattern 206. In the stack pattern SP2, a thickness of the buried insulation pattern 104 may be greater than a thickness of the semiconductor body pattern 206. The semiconductor body pattern 206 may have substantially the same configuration as that of the semiconductor body pattern 106 described with reference to FIGS. 1A and 1B.

In the integrated circuit device 200, the stack pattern SP2 and a portion of the bulk substrate 102 covered by the stack pattern SP2 may constitute the SOI region 102A.

A gate insulation layer 240 and a gate electrode 250 may be sequentially stacked on the bulk substrate 102. The gate insulation layer 240 and the gate electrode 250 may extend on the bulk substrate 102 to cover a portion of the first conductivity type well 122 and a portion of the stack pattern SP2. The gate electrode 250 may include a first gate portion 250A opposite to an upper surface of the first conductivity type well 122 with the gate insulation layer 140 therebetween, a second gate portion 250B opposite to an upper surface of the second conductivity type drift region 132 with the stack pattern SP2 and the gate insulation layer 140 therebetween, and a step portion 250C between the first gate portion 250A and the second gate portion 250B. The gate insulation layer 240 and the gate electrode 250 may have generally the same configurations as the gate insulation layer 140 and the gate electrode 150 described with reference to FIGS. 1A and 1B.

The stack pattern SP2 may include a portion that is not covered by the gate insulation layer 240 and the gate electrode 250 between the gate electrode 250 and the drain region 134. Thus, a local portion of the buried insulation pattern 104 and a local portion of the semiconductor body pattern 206 that are not covered by the gate electrode 250 may be disposed between the gate electrode 250 and the drain region 134.

Sidewalls of the gate insulation layer 240 and the gate electrode 250 may be at least partially covered by a first insulation spacer 256. A second part of the first insulation spacer 256 may be spaced apart from the bulk substrate 102 with the stack pattern SP2 therebetween and may at least partially cover the sidewall of the gate insulation layer 240 and the sidewall of the gate electrode 250, on the upper surface of the semiconductor body pattern 206. For example, the second part of the first insulation spacer 256 at least partially covering a sidewall of the second gate portion 250B may be disposed on the semiconductor body pattern 206. A first part of the first insulation spacer 256 at least partially covering a sidewall of the first gate portion 250A and the second part of the first insulation spacer 256 at least partially covering the sidewall of the second gate portion 250B may have a substantially same height. The first insulation spacer 256 may include the same material as the first insulation spacer 256 described with reference to FIGS. 1A and 1B.

A sidewall of the stack pattern SP2 adjacent to the drain region 134 may be at least partially covered by a second insulation spacer 258. The second insulation spacer 258 may be remote from the first insulation spacer 256. The second insulation spacer 258 may at least partially cover the sidewalls of the buried insulation pattern 104 and the semiconductor body pattern 206 adjacent to the drain region 134. The second insulation spacer 258 may include the same material as the first insulation spacer 256.

The drain region 134 may be disposed at a location self-aligned with the second insulation spacer 258 in the bulk substrate 102. In the integrated circuit device 200, because the portion of the stack pattern SP2 not covered by the gate electrode 250 is disposed between the gate electrode 250 and the drain region 134, a horizontal distance from the drain region 134 to the gate electrode 250 may be greater than a horizontal distance from the drain region 134 to the stack pattern SP2. A length of a current path in the second conductivity type drift region 132 may be varied based on a width of each of the gate electrode 250 and the stack pattern SP2 in the X direction. Thus, the width of each of the gate electrode 250 and the stack pattern SP2 in the X direction may be determined to secure an improved or optimum performance in based on a breakdown voltage of the EDMOS transistor TR2 and an on-resistance formed between the gate electrode 250 and the drain region 134 in the second conductivity type drift region 132.

In the stack pattern SP2, the semiconductor body pattern 206 may be used as a field plate. The semiconductor body pattern 206 may be connected to a field plate contact terminal FCT.

As shown in FIG. 8A, the integrated circuit device 200 includes a plurality of contacts CT constituting the gate contact terminal GCT, the source contact terminal SCT, the drain contact terminal DCT, and the field plate contact terminal FCT. A location of each of the plurality of contacts CT may be variously changed without being limited to that shown in FIG. 8.

A quantity of electrons drifting in the second conductivity type drift region 132 may be increased using the semiconductor body pattern 206 as the field plate, thus improving the current drivability and reducing the on-resistance. In addition, by adjusting a bias applied to the semiconductor body pattern 206 using the field plate contact terminal FCT, a width of a depletion region in the second conductivity type drift region 132 may be broadened, undesired peak electric field generated at a surface of the second conductivity type drift region 132 may be reduced, and electric field concentration at an edge portion of the gate electrode 250 may be reduced to increase the breakdown voltage. Accordingly, the integrated circuit device 200 may be advantageously used to implement input/output (I/O) circuits or RF circuits that require a relatively high operating voltage.

In some embodiments, the integrated circuit device 200 may further include the body contact region 126 as shown in FIG. 2. In some embodiments, the integrated circuit device 200 may further include the body contact region 126 and the source field insulation layer 128 as shown in FIG. 3.

Figure 9:
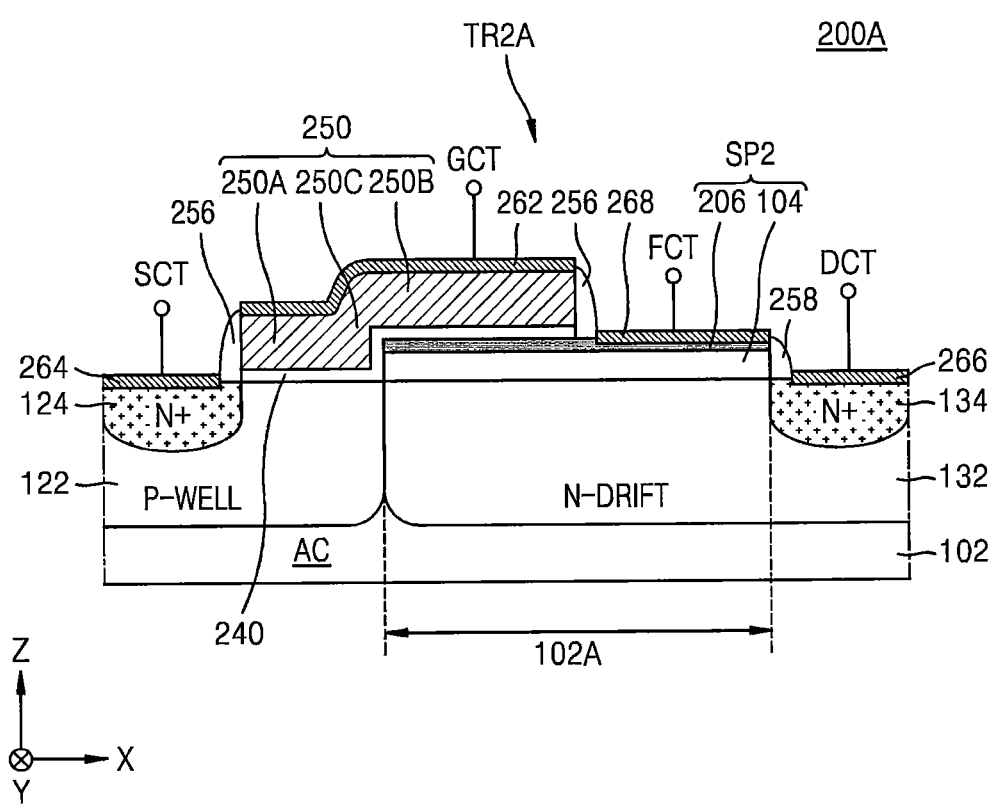
FIGS. 9 to 15 are cross-sectional views illustrating an integrated circuit device according to further example embodiments of the inventive concept.

FIG. 9 is a cross-sectional view illustrating an integrated circuit device according to example embodiments of the inventive concept. The same reference numerals are used to denote the same elements as shown in FIGS. 8A and 8B, and thus detailed descriptions thereof will be omitted.

Referring to FIG. 9, an integrated circuit device 200A may have generally the same configuration or structure as the integrated circuit device 200 described with reference to FIGS. 8A and 8B. However, an EDMOS transistor TR2A of the integrated circuit device 200A may further include a first metal silicide layer 262 at least partially covering an upper surface of the gate electrode 250, a second metal silicide layer 264 at least partially covering an upper surface of the source region 124, a third metal silicide layer 266 at least partially covering an upper surface of the drain region 234, and a fourth metal silicide layer 268 at least partially covering an upper surface of the semiconductor body pattern 206. The fourth metal silicide layer 268 may at least partially cover the portion of the semiconductor body pattern 206 not covered by the gate electrode 250. The semiconductor body pattern 206 and the fourth metal silicide layer 268 may constitute the field plate.

In some embodiments, the first to fourth metal silicide layers 262, 264, 266, and 268 may include nickel silicide, titanium silicide, and/or aluminum silicide, but are not limited thereto.

Figure 10:
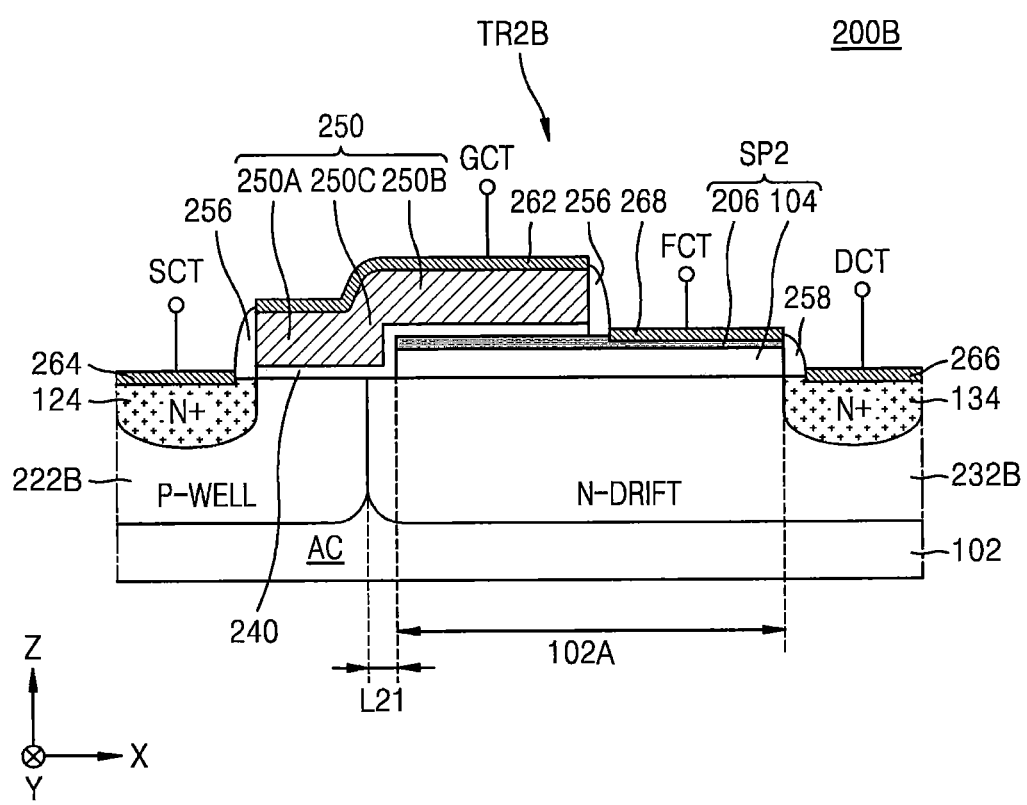

FIG. 10 is a cross-sectional view illustrating an integrated circuit device according to further example embodiments of the inventive concept. The same reference numerals are used to denote the same elements as shown in FIG. 9, and thus detailed descriptions thereof will be omitted.

Referring to FIG. 10, an integrated circuit device 200B may have generally the same configuration or structure as the integrated circuit device 200A described with reference to FIG. 9. However, an EDMOS transistor TR2B of the integrated circuit device 200B may further include a first conductivity type well 222B and a second conductivity type drift region 232B in the active region AC of the bulk substrate 102. The first conductivity type well 222B and the second conductivity type drift region 232B may contact each other at an upper surface of the bulk substrate 102 and in the bulk substrate 102 adjacent thereto. A region in which the first conductivity type well 222B and the second conductivity type drift region 232B contact each other at the upper surface of the bulk substrate 102 may be located below the first gate portion 250A. The first conductivity type well 222B may be disposed at a location spaced a first distance L21 apart from one end of the stack pattern SP2 along the horizontal direction in a direction far away from the drain region 134. The second conductivity type drift region 232B may be disposed below the stack pattern SP2 and may further extend by the first distance L21 from the one end of the stack pattern SP2 along the horizontal direction in the direction farther away from the drain region 134. The first gate portion 250A may include a portion opposite to an upper surface of the second conductivity type drift region 232B.

Figure 11:
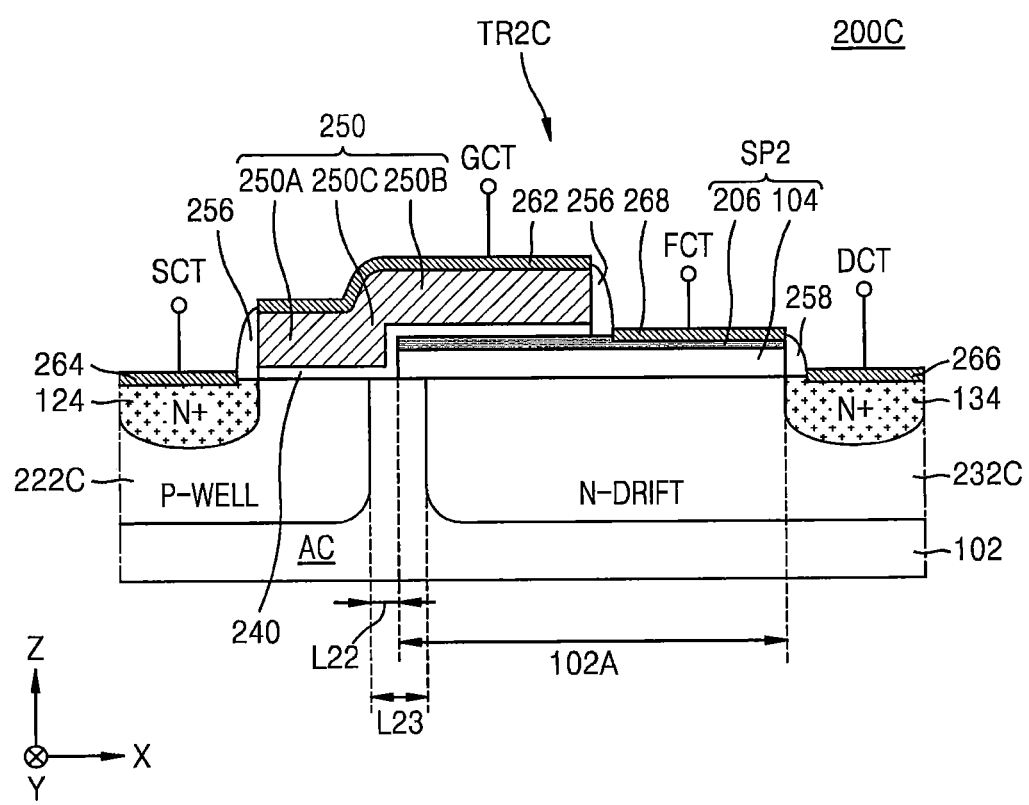

FIG. 11 is a cross-sectional view illustrating an integrated circuit device according to further example embodiments of the inventive concept. The same reference numerals are used to denote the same elements as shown in FIG. 9, and thus detailed descriptions thereof will be omitted.

Referring to FIG. 11, an integrated circuit device 200C may have generally the same configuration or structure as the integrated circuit device 200A described with reference to FIG. 9. However, an EDMOS transistor TR2C of the integrated circuit device 200C may include a first conductivity type well 222C and a second conductivity type drift region 232C in the active region AC of the bulk substrate 102. The first conductivity type well 222C and the second conductivity type drift region 232C may be spaced apart from each other.

The first conductivity type well 222C may be disposed at a location spaced a second distance L22 apart from one end of the stack pattern SP2 along the horizontal direction in a direction farther away from the drain region 134. A spaced distance L23 between the first conductivity type well 222C and the second conductivity type drift region 232C may be greater than the second distance L22. An end portion of the second conductivity type drift region 232C closest to the source region 124 may be located below the stack pattern SP2. Thus, a horizontal distance from the source region 124 to the second conductivity type drift region 232C may be less than a horizontal distance from the source region 124 to the stack pattern SP2.

The spaced distance L23 between the first conductivity type well 222C and the second conductivity type drift region 232C may be determined to improve or optimize the breakdown voltage and the on-resistance characteristic, in consideration of the HCI characteristic and/or the on-resistance characteristic based on the spaced distance L23.

Figure 12:
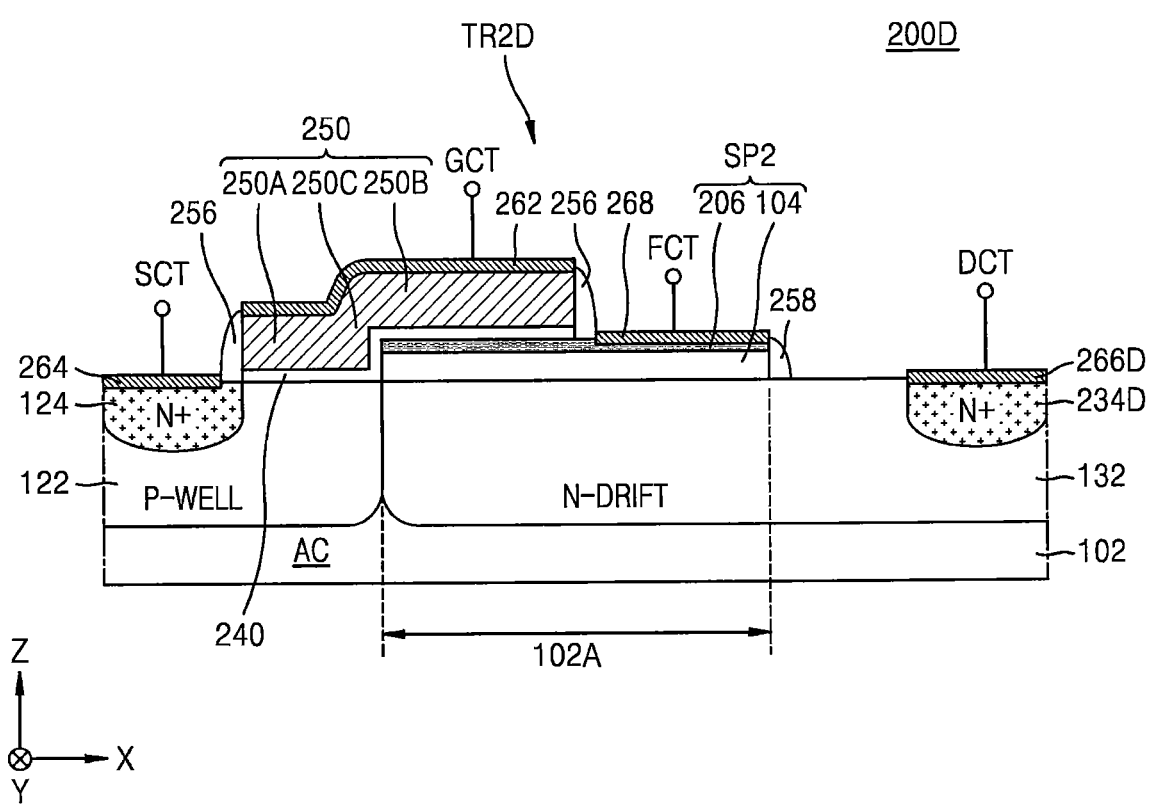

FIG. 12 is a cross-sectional view illustrating an integrated circuit device according to further example embodiments of the inventive concept. The same reference numerals are used to denote the same elements as shown in FIG. 9, and thus detailed descriptions thereof will be omitted.

Referring to FIG. 12, an integrated circuit device 200D may have generally the same configuration or structure as the integrated circuit device 200A described with reference to FIG. 9 However, in an EDMOS transistor TR2D of the integrated circuit device 200D, a drain region 234D may be disposed at a location spaced apart from the stack pattern SP2 in the horizontal direction, and a portion of the second conductivity type drift region 132 may be disposed between the stack pattern SP2 and the drain region 234D.

The drain region 234D may be spaced apart from the second insulation spacer 258 at least partially covering the sidewall of the stack pattern SP2. An upper surface of the drain region 234D may be covered by a third metal silicide layer 266D. The third metal silicide layer 266D may include nickel silicide, titanium silicide, and/or aluminum silicide.

In the integrated circuit device 200D of FIG. 12, a drift length may be increased due to the second conductivity type drift region 132 having an increasing length in the horizontal direction between the stack pattern SP2 and the drain region 234D, such that the current path in the second conductivity type drift region 132 may become relatively long. As the drain region 234D is farther away from the stack pattern SP2 and the source region 124, increase of the on-resistance may be suppressed. Thus, the breakdown voltage and/or the on-resistance characteristic may be improved or optimized by maintaining an improved or optimal distance between the gate electrode 150 and the drain region 234D as needed.

In the integrated circuit devices 200A, 200B, 200C, and 200D described with reference to FIGS. 9 to 12, a width of the second conductivity type drift regions 132, 232B, and 232C and/or a distance between the stack pattern SP2 and each of the drain regions 134 and 234D may be adjusted to obtain an integrated circuit device having an improved or optimum electrical performance based on a trade-off relationship of the electrical characteristics, such as the breakdown voltage, the leakage current, the gate-gate overlap capacitance, the on-resistance, the HCI, or the like. In addition, as a result, integrated circuit devices of various structures having variously modified and changed structures within the scope of the present inventive concept may be obtained.

Figure 13:
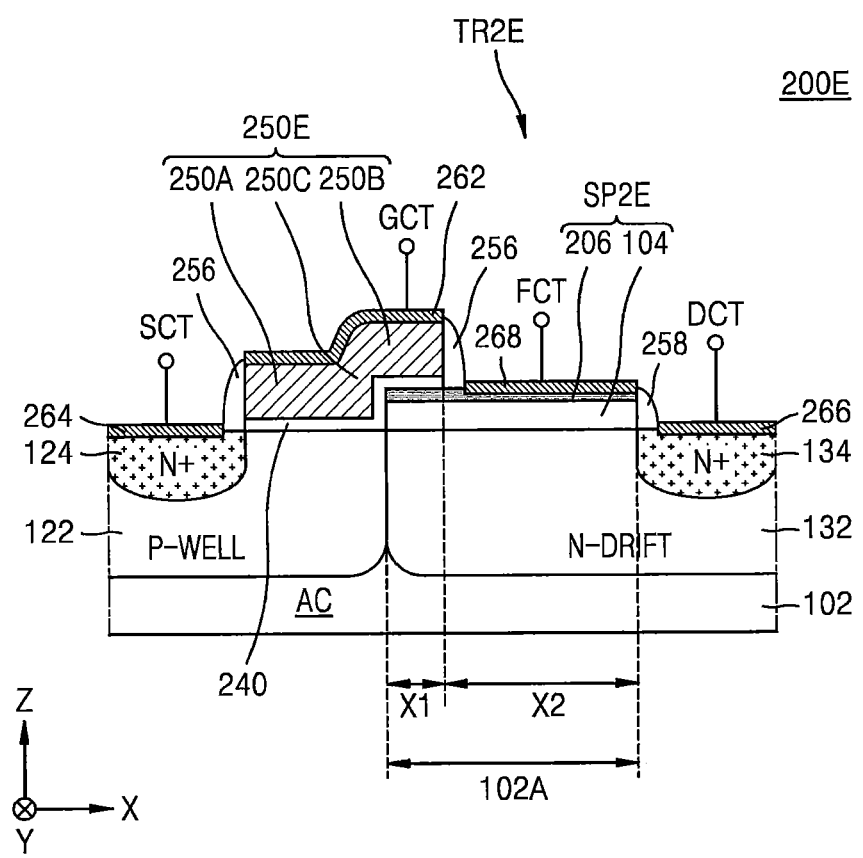

FIG. 13 is a cross-sectional view illustrating an integrated circuit device according to further example embodiments of the inventive concept. The same reference numerals are used to denote the same elements as shown in FIG. 9, and thus detailed descriptions thereof will be omitted.

Referring to FIG. 13, an integrated circuit device 200E may have generally the same configuration or structure as the integrated circuit device 200A described with reference to FIG. 9 However, in an EDMOS transistor TR2E of the integrated circuit device 200E, a width of a gate electrode 250E in the X direction may be less than a width of the gate electrode 250 in the X direction as shown in FIG. 9, and a width of a stack pattern SP2E in the X direction may be less than a width of the stack pattern SP2 in the X direction as shown in FIG. 9. The integrated circuit device 200E may be advantageously applied to a reduced highly integrated circuit device having a reduced or minimal cell size as a highly scaled result.

In the stack pattern SP2E of the integrated circuit device 200E, a width X1 in the X direction of a portion thereof at least partially covered by the gate electrode 250E may be less than a width X2 in the X direction of another portion thereof not covered by the gate electrode 250E. However, the width X1 in the X direction of the portion of the stack pattern SP2E at least partially covered by the gate electrode 250E may be variously set within the scope of the present inventive concept. For example, the width X1 in the X direction of the portion of the stack pattern SP2E at least partially covered by the gate electrode 250E may be equal to or greater than the width X2 in the X direction of another portion of the stack pattern SP2E not covered by the gate electrode 250E.

In the integrated circuit device 200E, the width of the gate electrode 250E in the X direction, the width of the stack pattern SP2E in the X direction, and the width X1 in the X direction of the portion of the stack pattern SP2E at least partially covered by the gate electrode 250E may be set to improve or optimize the breakdown voltage and/or the on-resistance characteristic.

Figure 14:
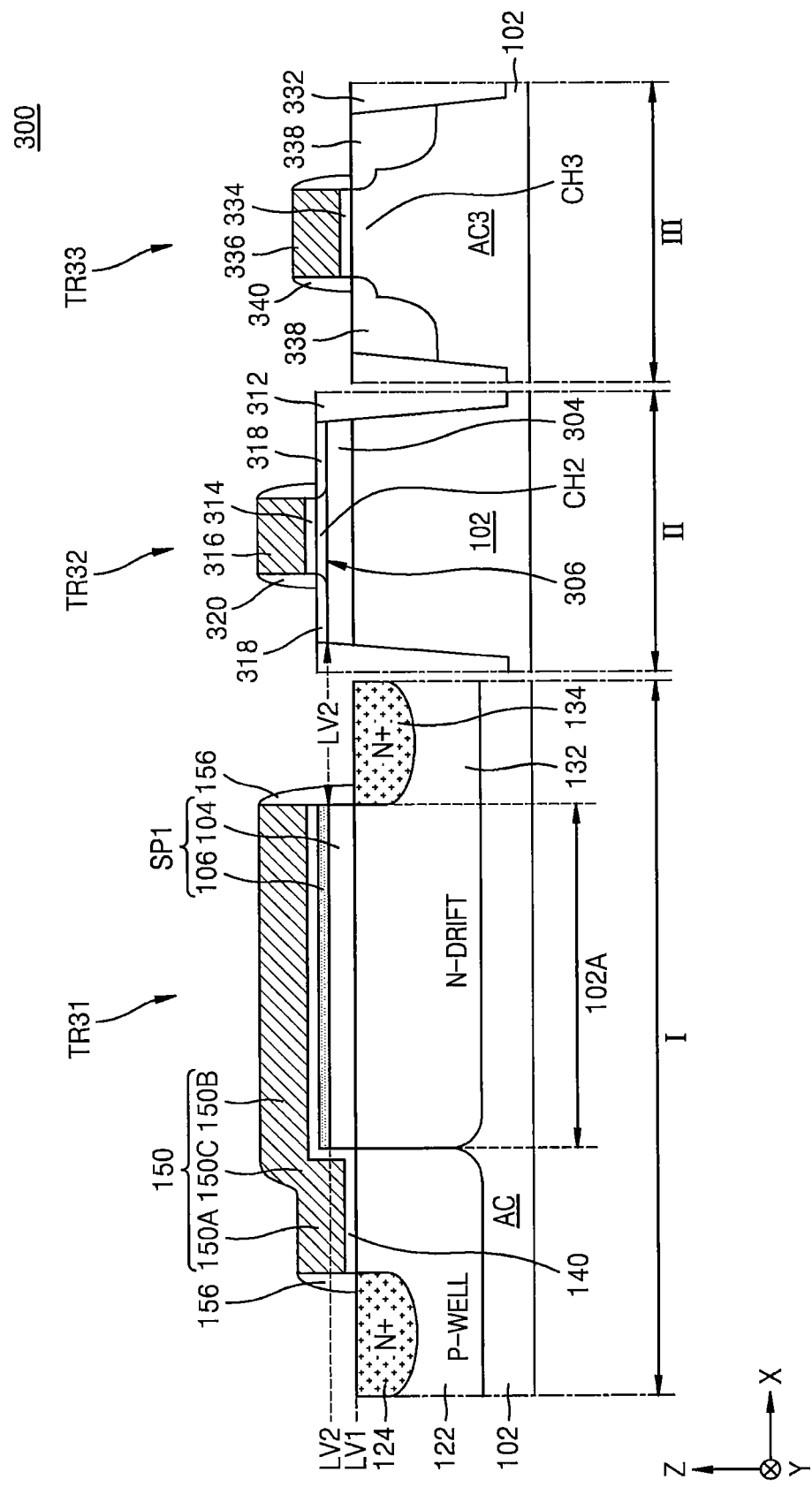

FIG. 14 is a cross-sectional view illustrating an integrated circuit device according to further example embodiments of the inventive concept. The same reference numerals are used to denote the same elements as shown in FIG. 9, and thus detailed descriptions thereof will be omitted.

Referring to FIG. 14, in an integrated circuit device 300, the bulk substrate 102 may include a first region I, a second region II, and a third region III that are spaced apart from each other in the horizontal direction (e.g., X direction or Y direction).

In some embodiments, the first region I may be a high voltage region in which a high voltage transistor subject to a relatively high operation voltage is formed, and the second region II and the third region III may be low voltage regions in which a low voltage transistor subject to a relatively low operation voltage is formed. As used herein, the high voltage transistor means a transistor of which an operation voltage is more than 1.0 V, and the low voltage transistor means a transistor of which an operation voltage is 1.0 V or less.

The first region I may be a region in which a transistor with a high reliability is formed, even if a threshold voltage thereof is relatively high and a switching speed thereof is not fast. The first region I may be a region in which peripheral circuits, for implementing a function of inputting external data into an internal circuit of the integrated circuit device 300 and outputting data from the inside circuit of the integrated circuit device 300 to the outside, are formed. In the first region I, a high voltage switching device for an input/output circuit, a high voltage transceiver for an RF circuit, a power amplifier, a converter, an inverter, a booster, and/or a part of electrostatic discharge protection circuit may be formed, but the present inventive concept is not limited thereto.

The second region II and the third region III may be regions in which a transistor having a relatively low threshold voltage and a high switching speed is formed. The second region II and the third region III may each be a portion of the cell array region in which unit memory cells are arranged in a matrix form. The second region II and third region III may each be a logic cell region or a memory cell region. The logic cell region may include various types of logic cells including a plurality of circuit elements, such as transistors or resistors, as standard cells for performing a desired logical function, such as a counter, a buffer, or the like. The memory cell region may be a region in which memory cells of at least one of an SRAM, a DRAM, an RRAM, and a PRAM are formed.

In the first region I, a first transistor TR31 may be disposed. The first transistor TR3 may have the same structure as the EDMOS transistor TR1 described with reference to FIGS. 1A to 1B, but the present inventive concept is not limited thereto. For example, the first transistor TR31 in the first region I may have generally the same structure as at least one of the EDMOS transistors TR1A, TR1B, TR1C, TR1D, TR1E, and TR1F described with reference to FIGS. 2 to 7 and modifications thereof.

The second region II may include an SOI structure in which the bulk substrate 102, a buried insulation layer 304, and a semiconductor body 306 are sequentially stacked. A second transistor TR32 disposed in the second region II may be a complete depletion transistor implemented using the SOI structure. The second transistor TR32 may include a channel region CH2 in the semiconductor body 306 defined by a first device isolation layer 312, a gate insulation layer 314, and a gate electrode 316 that are sequentially stacked on the channel region CH2, and a pair of source/drain regions 318 in the semiconductor body 306 at opposite sides of the gate electrode 316. The opposite sidewalls of the gate electrode 316 may be at least partially covered by an insulation spacer 320.

In the third region III, an active region AC3 may be defined in the bulk substrate 102 by a second device isolation layer 322. A third transistor TR33 may be disposed in the third region III. The third region TR33 may include a gate insulation layer 334 and a gate electrode 336 that are sequentially stacked on the active region AC3, and a pair of source/drain regions 338 in the active region AC3 at opposite sides of the gate electrode 316. A channel region CH3 of the third transistor TR33 may be disposed in the active region AC3 between the pair of source/drain regions 338. The opposite sidewalls of the gate electrode 336 may be covered by an insulation spacer 340.

In the integrated circuit device 300 shown in FIG. 14, the buried insulation pattern 104 of the first transistor TR31 may be positioned at the same level LV1 as the buried insulation layer 304 in the second region II, and the semiconductor body pattern 106 of the first transistor TR31 may be positioned at the same level LV2 as the semiconductor body 306 in the second region II. As used herein, the term "level" means a distance in a vertical direction (e.g., Z direction) from the upper surface of the bulk substrate 102. The buried insulation pattern 104 of the first transistor TR31 may be formed of the same material as the buried insulation layer 304 in the second region II.

In the integrated circuit device 300, the gate insulation layer 140 of the first transistor TR31 may have the same thickness as at least one of the gate insulation layer 314 of the second transistor TR32 in the second region H and the gate insulation layer 334 of the third transistor TR33 in the third region III. In some embodiments, the gate insulation layer 140 in the first region I may have a relatively thin thickness of about 25 to 35 Å. For example, the gate insulation layer 140 in the first region I may have a double layered structure including a silicon oxide layer and a hafnium oxide layer. In this case, the gate insulation layer 140 in the first region I may include a silicon oxide layer of about 10 to 15 Å and a hafnium oxide layer of about 15 to 20 Å. As the gate insulation layer 140 of the first transistor TR31 in the first region I is formed relatively thin, the maximum transconductance (Gm) in the first transistor T31 may be improved, such that the improved cutoff frequency ($f_T$) characteristic may be achieved.

Figure 15:
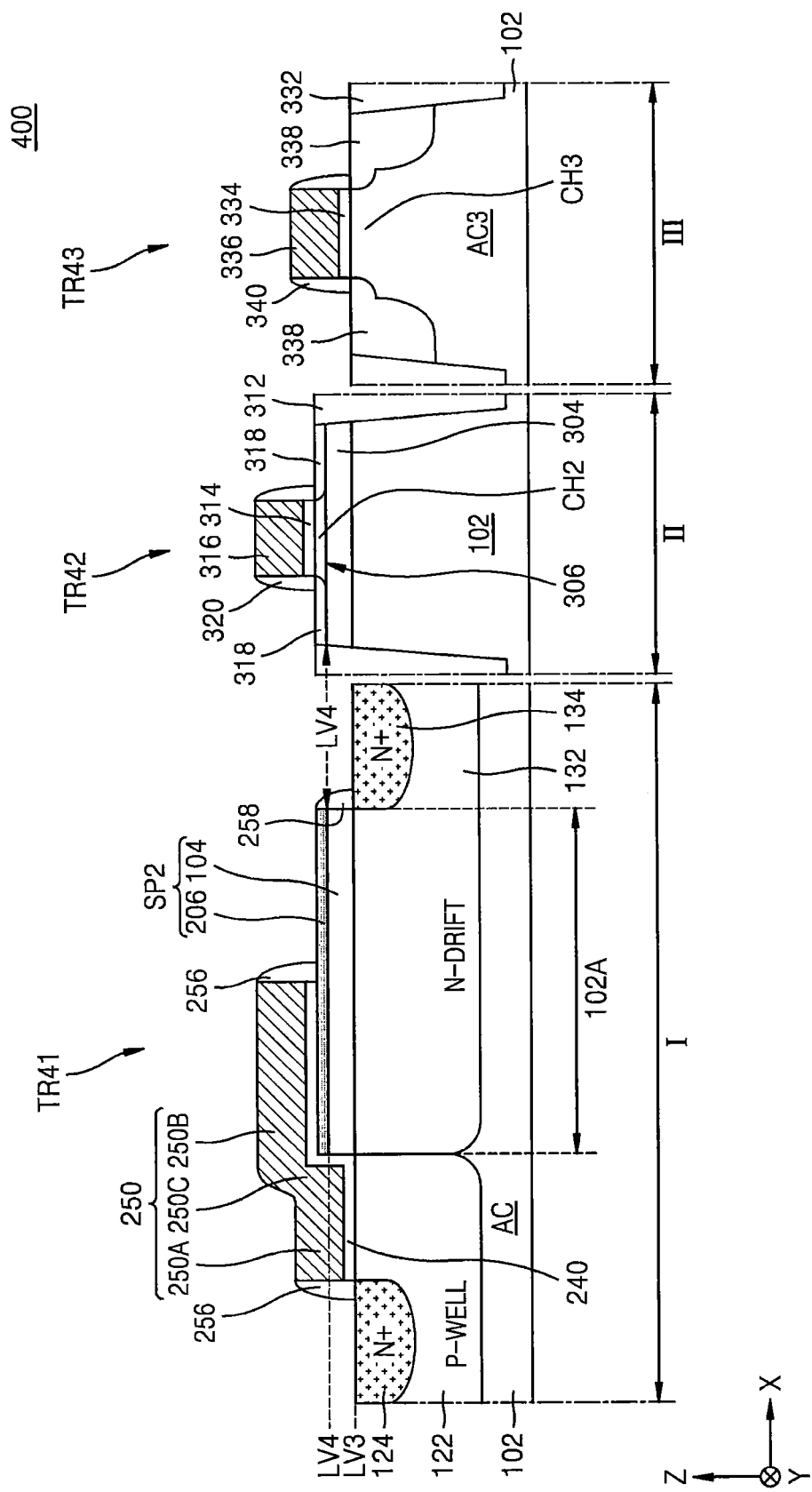

FIG. 15 is a cross-sectional view illustrating an integrated circuit device according to example embodiments of the inventive concept. The same reference numerals are used to denote the same elements as shown in FIGS. 8B and 14, and thus detailed descriptions thereof will be omitted.

Referring to FIG. 15, an integrated circuit device 400 may include a first transistor TR41 in the first region I of the bulk substrate 102.

The first transistor TR41 may have substantially the same structure as the EDMOS transistor TR2 described with reference to FIGS. 8A and 8B, but the present inventive concept is not limited thereto. For example, the first transistor TR41 in the first region I may have the same structure as at least one of the EDMOS transistors TR2A, TR2B, TR2C, TR2D, and TR2E as described with reference to FIGS. 9 to 13 and modifications thereof.

A second transistor TR42 that is a complete depletion transistor may be disposed in the second region II, and a third transistor TR43 may be disposed in the third region III. The second transistor TR42 and the third transistor TR43 may be the same structure as the second transistor TR32 and the third transistor TR33 described with reference to FIG. 14.

In the integrated circuit device 400, the buried insulation pattern 104 of the first transistor TR41 may be positioned at the same level LV3 as the buried insulation layer 304 in the second region II, and the semiconductor body pattern 206 of the first transistor TR41 may be positioned at the same level LV4 as the semiconductor body 306 in the second region II. The buried insulation pattern 104 of the first transistor TR41 may be formed of the same material as the buried insulation layer 304 in the second region II.

In the integrated circuit device 400, the gate insulation layer 240 of the first transistor TR41 may have the same thickness as at least one of the gate insulation layer 314 of the second transistor TR42 in the second region II and the gate insulation layer 334 of the third transistor TR43 in the third region III. The gate insulation layer 240 may have the same configuration as the gate insulation layer 140 described with reference to FIG. 14. As the gate insulation layer 240 of the first transistor TR41 in the first region I is formed relatively thin, the maximum transconductance (Gm) in the first transistor TR41 may be improved, such that the improved cutoff frequency ($f_T$) characteristic may be achieved.

FIGS. 16A to 16G are cross-sectional views illustrating stages in a method of manufacturing an integrated circuit device according to example embodiments of the inventive concept. A method of manufacturing the integrated circuit device 100C shown in FIG. 4 and modifications thereof will be described with reference to FIGS. 16A to 16G. The same reference numerals are used to denote the same elements as shown in FIGS. 1A to 7, and thus detailed descriptions thereof will be omitted.

Figure 16A:
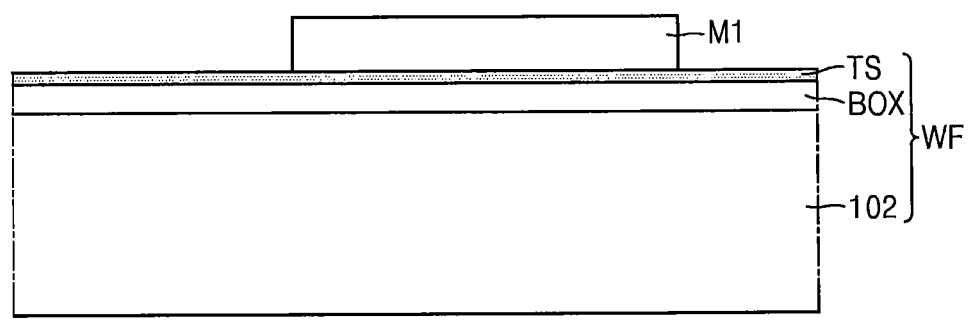
FIGS. 16A to 16G are cross-sectional views illustrating intermediate stages in a method of manufacturing an integrated circuit device according to example embodiments of the inventive concept.

Referring to FIG. 16A, an SOI wafer WF including the bulk substrate 102, a buried insulation layer BOX, and a top semiconductor layer TS may be provided. A mask pattern M1 at least partially covering a portion of the top semiconductor layer TS may be formed on the SOI wafer WF.

The buried insulation layer 304 may be formed of a silicon oxide layer. The top semiconductor layer TS may be formed of a semiconductor, e.g., silicon. The mask pattern M1 may be formed of an oxide layer, a nitride layer, a carbon-containing layer, or combinations thereof.

In the case in which the integrated circuit device 300 shown in FIG. 14 or the integrated circuit device 400 shown in FIG. 15 is formed form the SOI wafer WF, the bulk substrate 102 of the SOI substrate WF may include the first region I, the second region II, and the third region III shown in FIG. 14 or FIG. 15. In the first region I, at least a portion of an upper surface of the top semiconductor layer TS may be covered by the mask pattern M1. The mask pattern M1 in the second region II may be formed to completely cover the top semiconductor layer TS. The top semiconductor layer TS in the third region III may not be covered by the mask pattern M1.

Figure 16B:
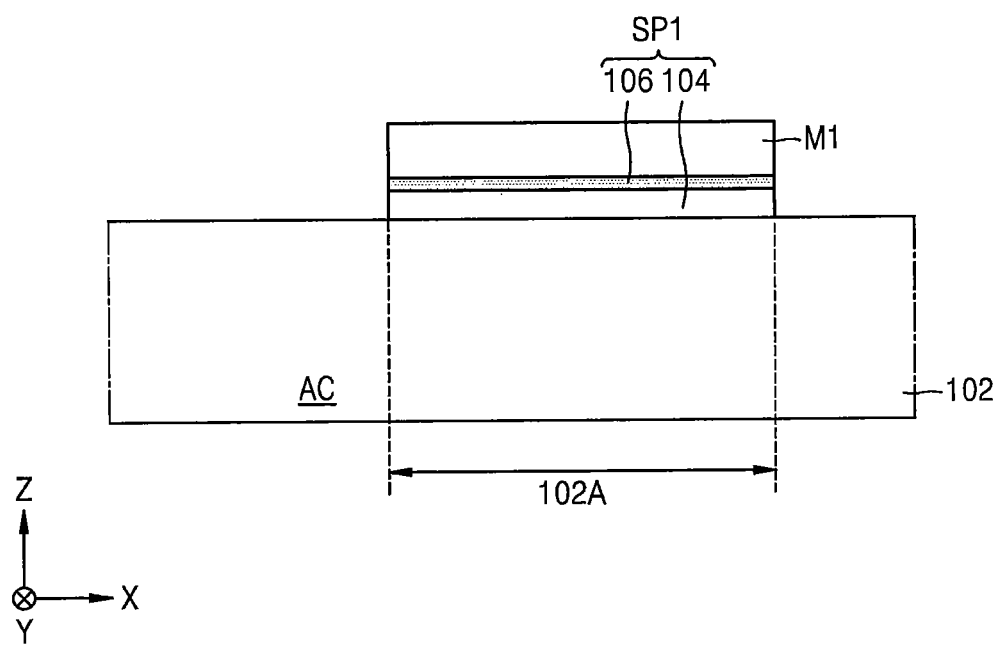

Referring to FIG. 16B, at least a portion of the buried insulation layer BOX and at least a portion of the top semiconductor layer TS may be anisotropically etched using the mask pattern M1 as an etch mask to form the stack pattern SP1 including the buried insulation pattern 104 and the semiconductor body pattern 106 on the bulk substrate 102. The stack pattern SP1 and at least a portion of the bulk substrate 102 covered by the stack pattern SP1 may constitute the SOI region 102A.

In the case in which the integrated circuit device 300 shown in FIG. 14 or the integrated circuit device 400 shown in FIG. 15 is formed, when the stack pattern SP1 is formed in the first region I, the buried insulation layer BOX and the top semiconductor layer TS may remain in the second region II and may be at least partially removed in the third region III to expose an upper surface of the bulk substrate 102.

Figure 16C:
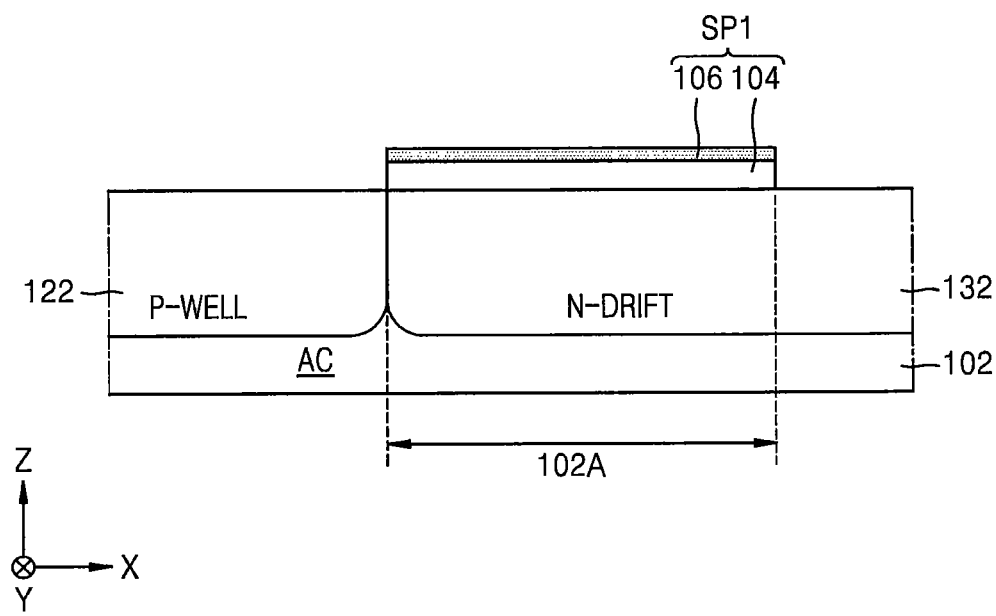

Referring to FIG. 16C, after the mask pattern M1 is at least partially removed from the resulting structure of FIG. 16B, the first conductivity type well 122 and the second conductivity type drift region 132 may be sequentially formed in the bulk substrate 102.

To form the first conductivity type well 122, p-type impurity ions, such as boron (B) are injected into the bulk substrate 102. To form the second conductivity type drift region 132, n-type impurity ions, such as phosphorous (P) or arsenic (As) may be injected into the bulk substrate 102. Before injecting the p-type impurity ions and the n-type impurity ions, a protection layer may be formed on the resulting structure of FIG. 16B. After injecting the p-type impurity ions and the n-type impurity ions through the protection layer, the protection layer may be removed. The protection layer may be formed of silicon oxide, but is not limited thereto.

A shape or dimension of each of an ion injection mask pattern used for the injection process of the p-type impurity ions and an ion injection mask pattern used for the injection process of the n-type impurity ions may be modified to fabricate the integrated circuit devices of various structures according to example embodiments of the present inventive concept. In some embodiments, to form the integrated circuit device 100D shown in FIG. 5, the first conductivity type well 122D and the second conductivity type drift region 132D shown in FIG. 5 may be formed instead of the first conductivity type well 122 and the second conductivity type drift region 132. In some embodiments, to form the integrated circuit device 100E shown in FIG. 6, the first conductivity type well 122E and the second conductivity type drift region 132E shown in FIG. 6 may be formed instead of the first conductivity type well 122 and the second conductivity type drift region 132.

Figure 16D:
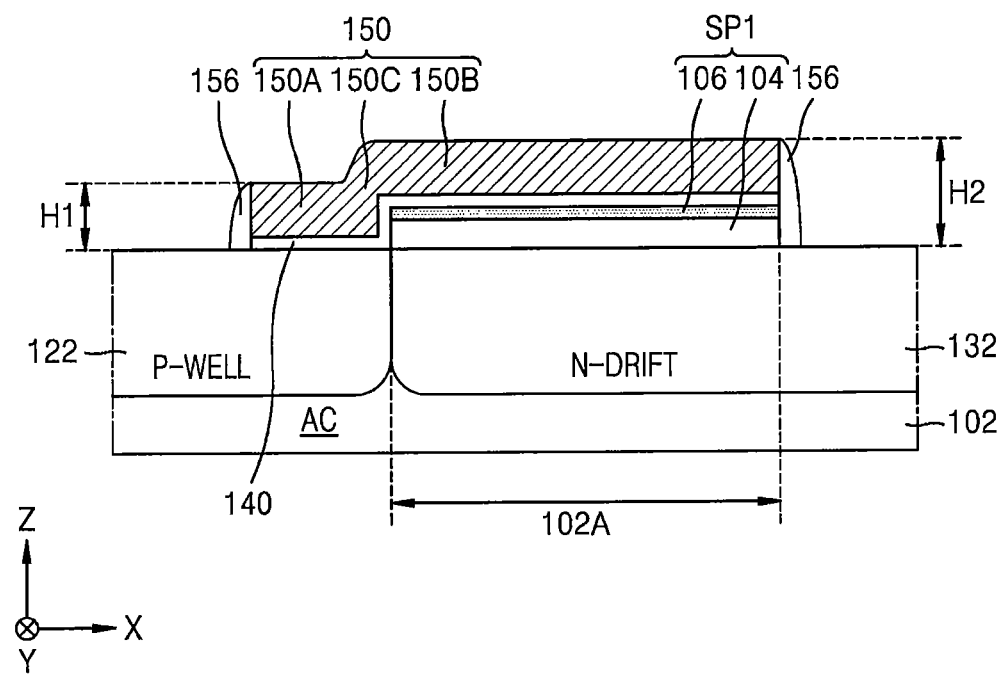

Referring to FIG. 16D, after the gate insulation layer 140 and the gate electrode 150 are formed on the resulting structure of FIG. 16C, the insulation spacer 156 may be formed to at least partially cover sidewalls of each of the gate insulation layer 140 and the gate electrode 150.

To the gate insulation layer 140 and the gate electrode 150, a preliminary gate insulation layer and a preliminary gate electrode layer may be sequentially formed to at least partially cover an entire surface of the resulting structure of FIG. 16C and then may be patterned to form the gate insulation layer 140 and the gate electrode 150. To form the insulation spacer 156, an insulation layer is conformally formed to at least partially cover the resulting structure including the gate electrode 150 and then may be etched back. The insulation layer may be formed of an oxide layer, a nitride layer, or a combination thereof.

A second part of the insulation spacer 156 at least partially covering a sidewall of the second gate portion 150B of the gate electrode 150 may also be formed to at least partially cover a sidewall of the stack pattern SP1. After the insulation spacer 156 is formed, a height of the insulation spacer 156 may be varied based on a location. For example, a height H2 of the second gate part of the insulation spacer 156 at least partially covering the second gate portion 150B of the gate electrode 150 may be greater than a height H1 of a first part of the insulation spacer 156 at least partially covering the first gate portion 150A of the gate electrode 150.

Figure 16E:
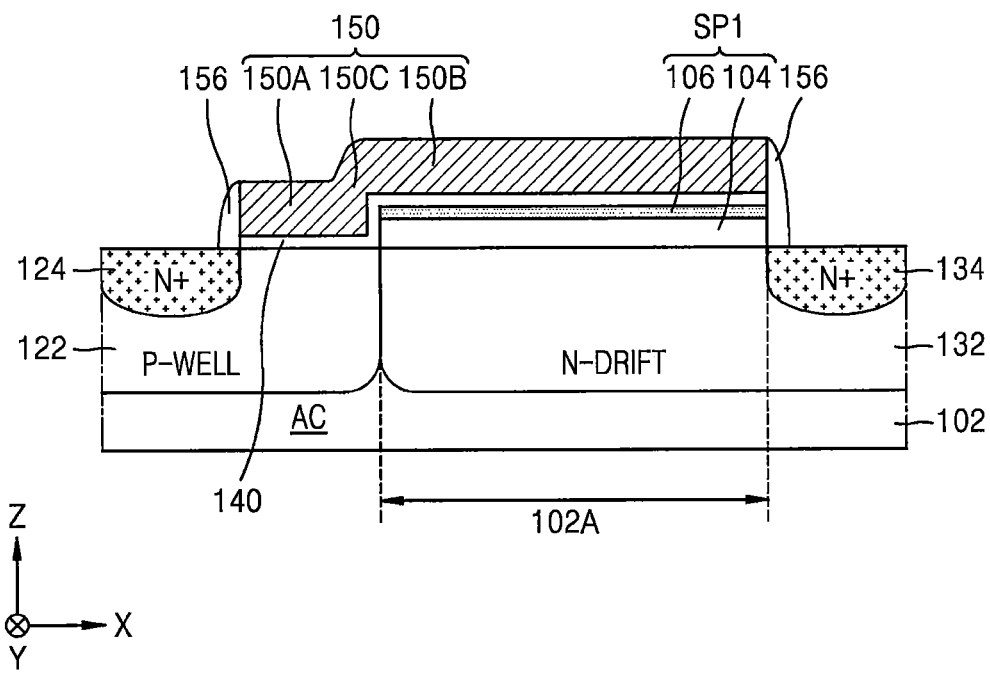

Referring to FIG. 16E, the source region 124 may be formed in the first conductivity type well 122, and the drain region 134 may be formed in the second conductivity type drift region 132. To from the source region 124 and the drain region 134, n-type impurity ions, such as phosphorus (P) or arsenic (As), may be injected in the first conductivity type well 122 and the second conductivity type drift region 132. In some embodiments, before the source region 124 and the drain region 134 are formed, a protection layer may be formed on the resulting structure of FIG. 16D, and the process of injecting the impurity ions may be performed through the protection layer. The protection layer may be removed after the source region 124 and the drain region 134 are formed. The protection layer may be formed of silicon oxide, but is not limited thereto. Each of the source region 124 and the drain region 134 may be formed at a location self-aligned with the insulation spacer 156.

In some embodiments, to form the integrated circuit device 100A shown in FIG. 2, the body contact region 126 shown in FIG. 2 may be further formed in the first conductivity type well 122. In some embodiments, to form the integrated circuit device 100B shown in FIG. 3, the body contact region 126 and the source field insulation layer 128 shown in FIG. 3 may be further formed in the first conductivity type well 122. The source field insulation layer 128 may be formed by a shallow trench isolation (STI) process. The source field insulation layer 128 may be formed of an oxide layer. The body contact region 126 may be formed before or after the source region 124 and the drain region 134 are formed.

In some embodiments, to form the integrated circuit device 100F shown in FIG. 7, the drain region 134F instead of the drain region 134 shown in FIG. 16E may be formed in the second conductivity type drift region 132 to be spaced apart from the stack pattern SP1 in the horizontal direction.

Figure 16F:
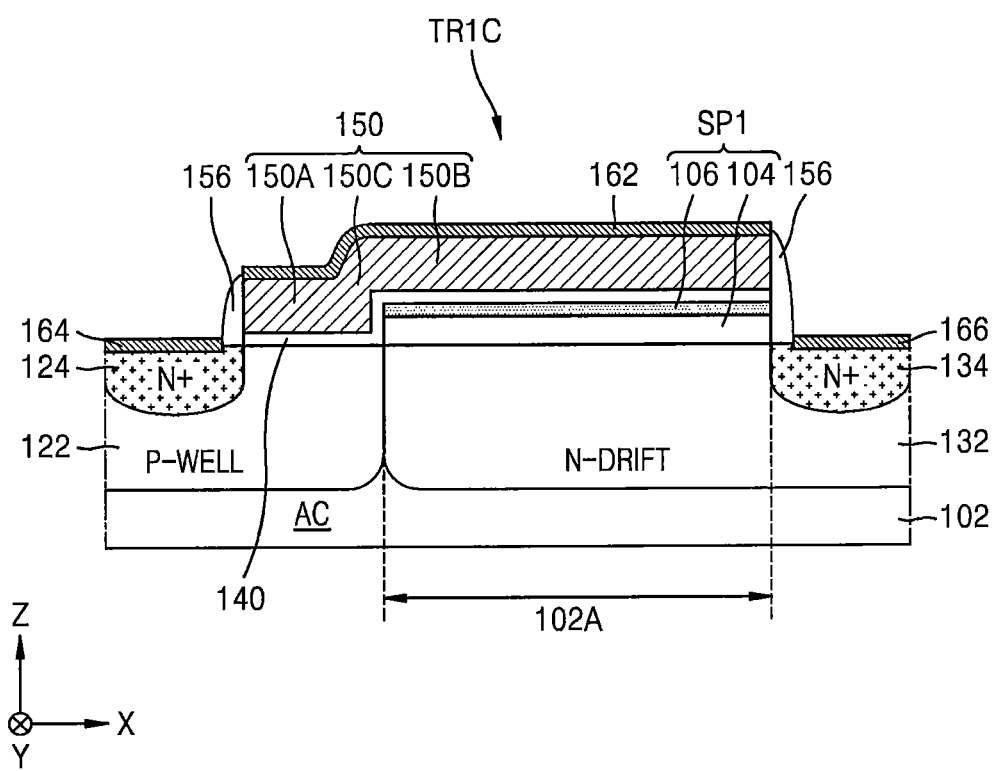

Referring to FIG. 16F, a salicide process be performed on the resulting structure of FIG. 16E to form the first to third metal silicide layers 162, 164, and 166, such that the EDMOS transistor TR1C shown in FIG. 4 may be formed.

In some embodiments, in the case in which the drain region 134F shown in FIG. 7 is disposed in the second conductivity type drift region 132 to be spaced apart from the stack pattern SP1 in the horizontal direction, the third metal silicide layer 166F may be formed on an upper surface of the drain region 134F. In the case in which the integrated circuit device 100 shown in FIG. 1B is formed, the salicide process described with reference to FIG. 16F may be omitted.

Figure 16G:
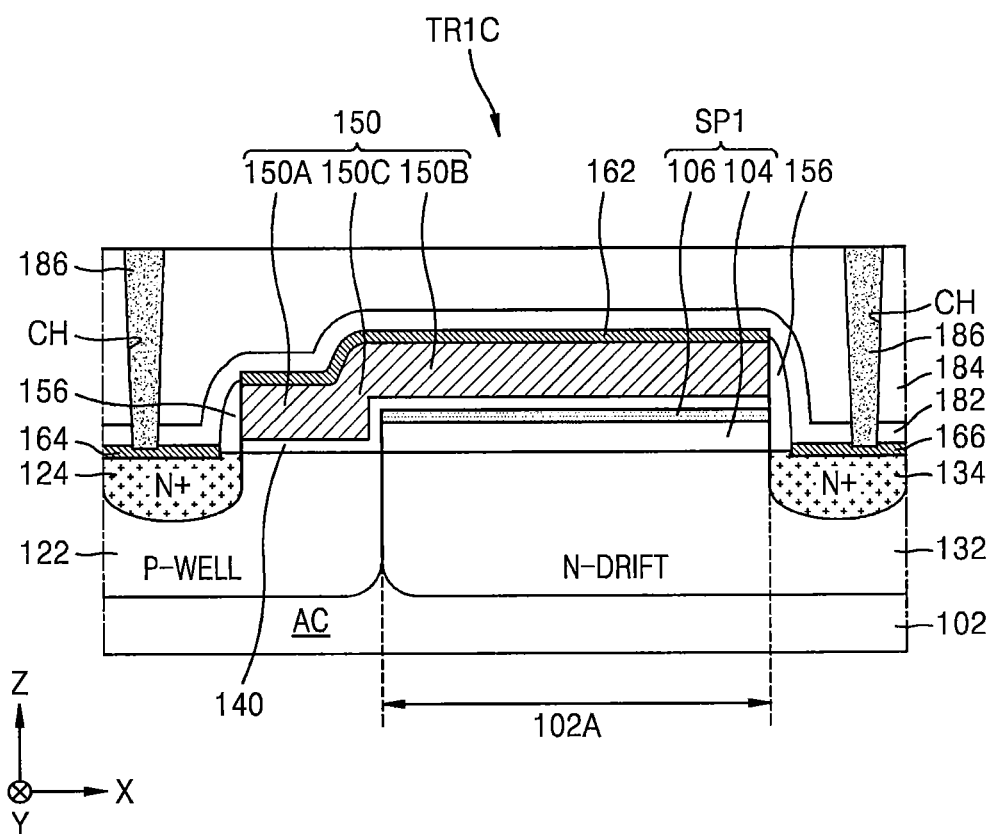

Referring to FIG. 16G, an insulation capping layer 182 and an interlayer insulation layer 184 may be formed on the resulting structure of FIG. 16F, and then may be partly etched to form a plurality of contact holes CH exposing the second metal silicide layer 164 on the source region 124 and the third metal silicide layer 166 on the drain region 134. A plurality of conductive contact plugs 186 may be formed to at least partially fill the plurality of contact holes CH. The plurality of conductive contact plugs 186 may constitute the plurality of contacts CT shown in FIG. 1A.

In the case in which the integrated circuit device 300 shown in FIG. 14 is formed from the SOI wafer WF shown in FIG. 16A, the first transistor TR31 having the same structure as the EDMOS transistor TR1 shown in FIG. 1B may be formed in the first region I by the process described with reference to FIGS. 16A to 16F, the second transistor TR32 may be formed in the second region II, and the third transistor TR33 may be formed in the third region III. The order of formation of the elements of each of the first transistor TR31, the second transistor TR32, and the third transistor TR33 may be variously determined. In some embodiments, at least some of the elements of each of the first transistor TR31, the second transistor TR32, and the third transistor TR33 may be formed at the same time.

According to the method of manufacturing the integrated circuit device described with reference to FIGS. 16A to 16G, the SOI wafer shown in FIG. 16A may be processed so that the stack pattern SP1 may be left on a portion of the bulk substrate 102 to form the EDMOS transistor TR1C including the SOI region 102A. A relatively great distance between the gate electrode 150 and the second conductivity type drift region 132 may be maintained using the relatively thick buried insulation pattern 104 included in the stack pattern SP1 to reduce the vertical electric field in the gate electrode 150. Thus, in the EDMOS transistor TR1C, the HCI and the gate-drain overlap capacitance (Cgd) may be reduced or minimized and the leakage current in the off-state may be suppressed, such that the improved cutoff frequency ($f_T$) characteristic may be achieved.

FIGS. 17A to 17D are cross-sectional views illustrating stages in a method of manufacturing an integrated circuit device according to example embodiments of the inventive concept. A method of manufacturing the integrated circuit device 200A shown in FIG. 9 and modifications thereof will be described with reference to FIGS. 17A to 17D. The same reference numerals are used to denote the same elements as shown in FIGS. 1A to 16G, and thus detailed descriptions thereof will be omitted.

Figure 17A:
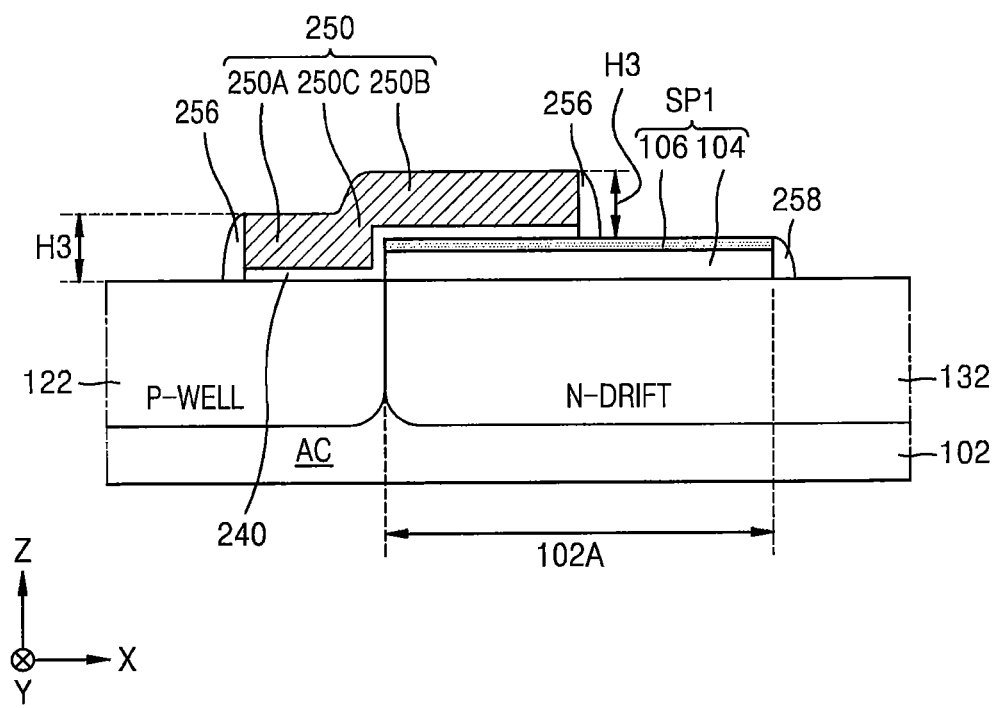
FIGS. 17A to 17D are cross-sectional views illustrating intermediate stages in a method of manufacturing an integrated circuit device according to further example embodiments of the inventive concept.

Referring to FIG. 17A, by a similar method to that described with reference to FIGS. 16A to 16C, the stack pattern SP1 including the buried insulation pattern 104 and the semiconductor body pattern 106 may be formed on the bulk substrate 102, and the first conductivity type well 122 and the second conductivity type drift region 132 may be formed in the bulk substrate 102.

In some embodiments, to form the integrated circuit device 200B shown in FIG. 10, the first conductivity type well 222B and the second conductivity type drift region 232B shown in FIG. 10 may be formed instead of the first conductivity type well 122 and the second conductivity type drift region 132. In some embodiments, to form the integrated circuit device 200C shown in FIG. 11, the first conductivity type well 222C and the second conductivity type drift region 232C shown in FIG. 11 may be formed instead of the first conductivity type well 122 and the second conductivity type drift region 132.

Thereafter, by a similar method to that described with reference to FIG. 16D, the gate insulation layer 240 and the gate electrode 250 may be formed on the bulk substrate 102, and the first insulation spacer 256 at least partially covering sidewalls of each of gate insulation layer 240 and the gate electrode 250 and the second insulation spacer 258 at least partially covering a sidewall of the stack pattern SP1 may be formed.

The gate insulation layer 240 and the gate electrode 250 may be formed to at least partially cover a portion of the stack pattern SP1.

To form the first insulation spacer 256 and the second insulation spacer 258, an insulation layer may be formed to conformally at least partially cover the resulting structure including the gate electrode 250, and then the insulation layer may be etched back. The first insulation spacer 256 and the second insulation spacer 258 may be formed from the insulation layer at the same time. The second part of the first insulation spacer 256 at least partially covering a sidewall of the second gate portion 250B of the gate electrode 250 may be formed on the semiconductor body pattern 106. The second part of the first insulation spacer 256 at least partially covering a sidewall of the second gate portion 250B of the gate electrode 250 and the first part of the first insulation spacer 256 at least partially covering the first gate portion 250A of the gate electrode 250 may have a substantially same height H3. After the first insulation spacer 256 and the second insulation spacer 258 are formed, an upper surface of the semiconductor body pattern 106 may be exposed around the second gate portion 250B of the gate electrode 250.

Figure 17B:
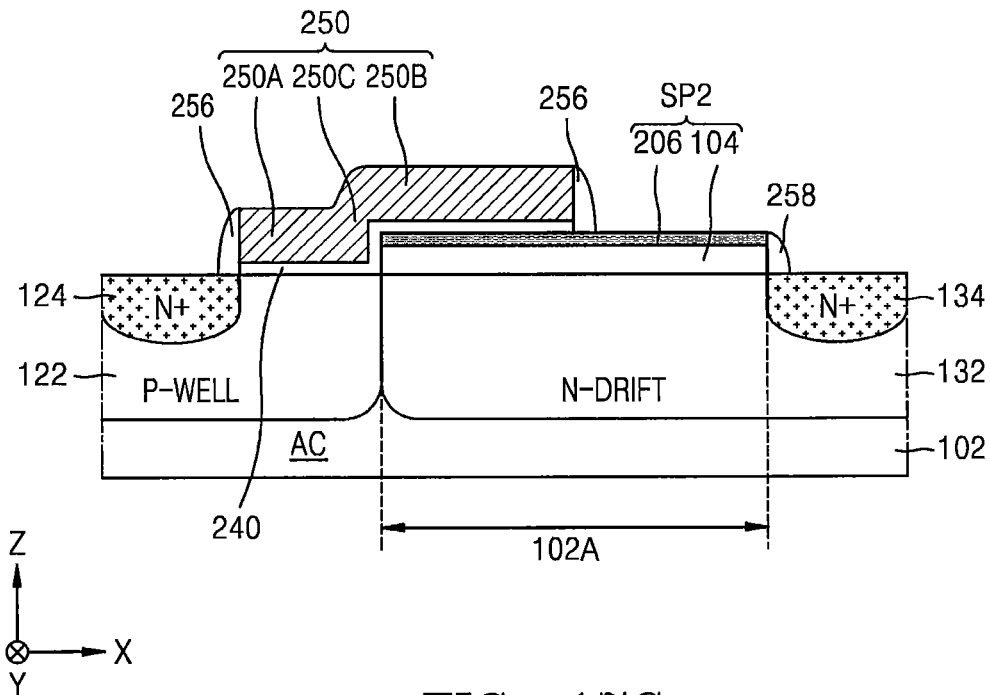

Referring to FIG. 17B, the source region 124 and the drain region 134 may be formed by a similar method to that described with reference to FIG. 16E. However, in the present embodiment, while n-type impurity ions are injected into the first conductivity type well 122 and the second conductivity type drift region 132 to form the source region 124 and the drain region 134, the n-type impurity ions may be injected into the semiconductor body pattern 106 through the exposed upper surface of the semiconductor body pattern 106. The n-type impurity ions injected into the semiconductor body pattern 106 may be diffused within the semiconductor body pattern 106 by the following annealing process. Thus, the stack pattern SP2 including the semiconductor body pattern 206 formed of a doped conductive semiconductor material may be formed.

In some embodiments, the body contact region 126 shown in FIG. 2 may be further formed in the first conductivity type well 122. In some embodiments, the body contact region 126 and the source field insulation layer 128 shown in FIG. 3 may be further formed in the first conductivity type well 122. In some embodiments, to form the integrated circuit device 200D shown in FIG. 12, the drain region 234D shown in FIG. 12 may be formed instead of the drain region 134 shown in FIG. 17B.

Figure 17C:
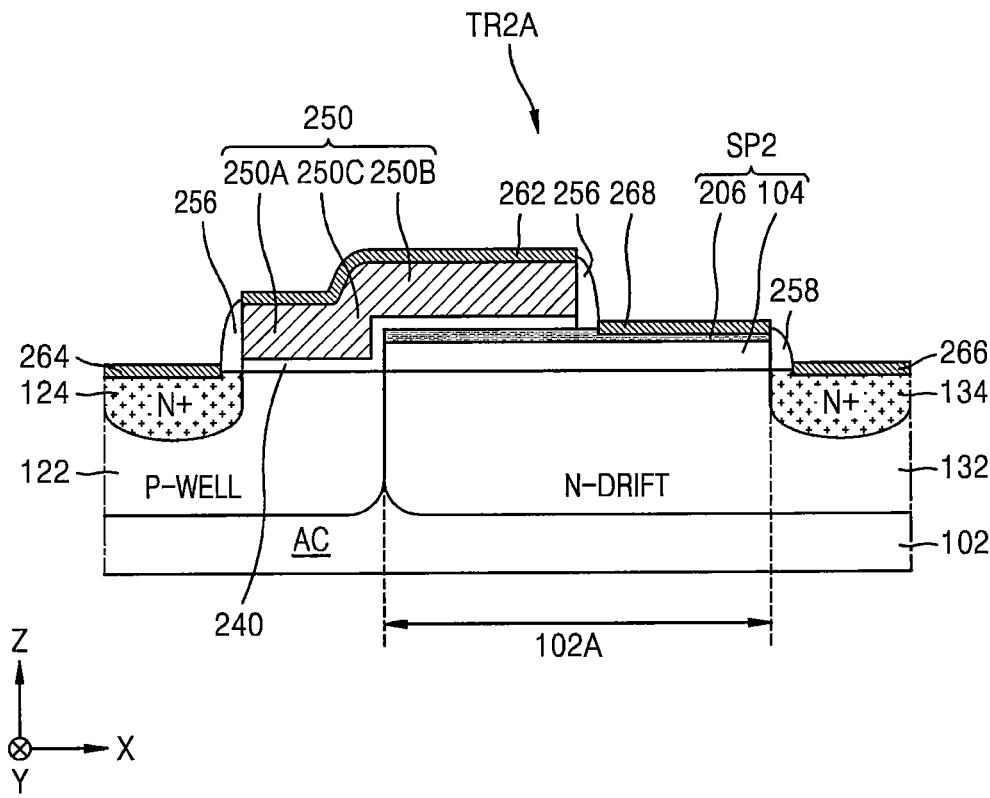

Referring to FIG. 17C, by a similar method to that described with reference to FIG. 16F, the first to third metal silicide layers 262, 264, and 266 may be formed on the resulting structure of FIG. 17B by the silicide process to form the EDMOS transistor TR2A shown in FIG. 9.

In some embodiments, in the case in which the drain region 234D shown in FIG. 12 is disposed in the second conductivity type drift region 132 to be spaced apart from the stack pattern SP2 in the horizontal direction, the third metal silicide layer 266D may be formed on the upper surface of the drain region 234D. In the case in which the integrated circuit device 200 shown in FIG. 8B is formed, the silicide process described with reference to FIG. 17C may be omitted.

Figure 17D:
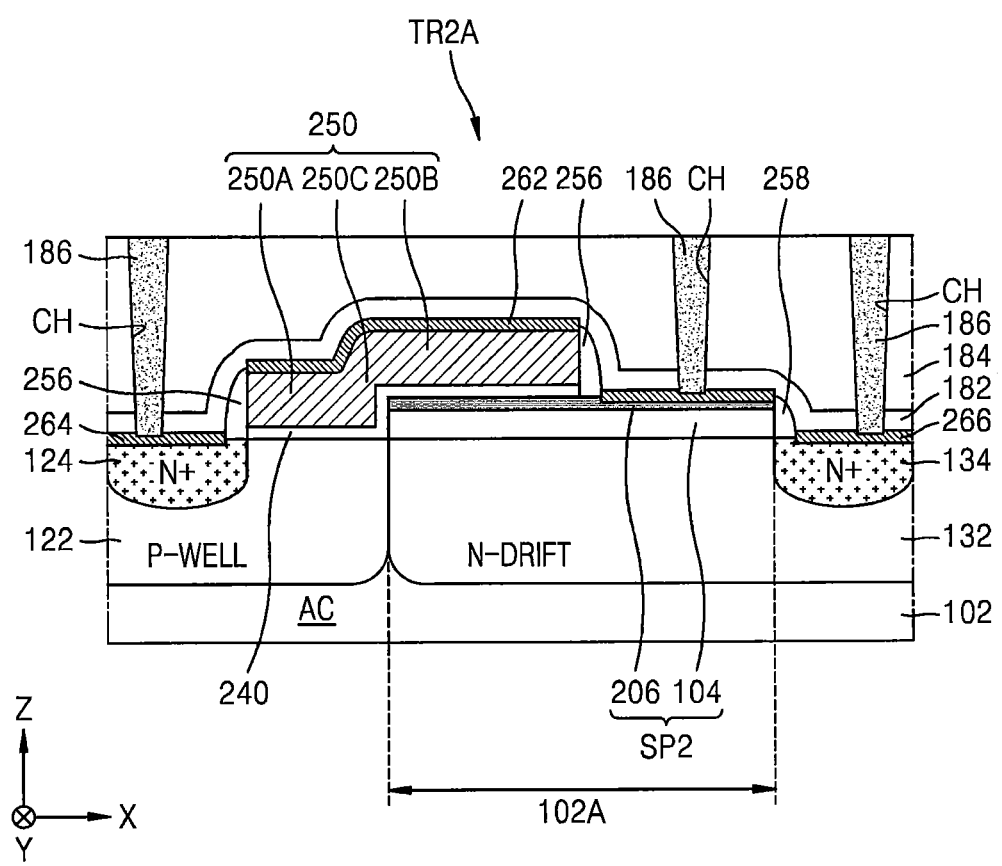

Referring to FIG. 17D, by a similar method to that described with reference to FIG. 16G, the insulation capping layer 182 and the interlayer insulation layer 184 may be sequentially formed and then may be partly etched to form the plurality of contact holes CH, and the plurality of conductive contact plugs 186 may be formed to fill the plurality of contact holes CH. The plurality of conductive contact plugs 186 may constitute the plurality of contacts CT.

In some embodiments, in the case in which the integrated circuit device 400 shown in FIG. 15 is formed from the SOI wafer WF shown in FIG. 16A, according to the processes described with reference to FIGS. 17A to 17D, the first transistor TR41 having the same structure as the EDMOS transistor TR2 shown in FIG. 8B may be formed in the first region I, the second transistor TR42 may be formed in the second region II, and the third transistor TR43 may be formed in the third region III. The order of formation of the elements of each of the first transistor TR41, the second transistor TR42, and the third transistor TR43 may vary in accordance with different embodiments of the inventive concept. At least some of the elements of each of the first transistor TR41, the second transistor TR42, and the third transistor TR43 may be formed at the same time.

According to the method of manufacturing the integrated circuit device described with reference to FIGS. 17A to 17D, the SOI wafer WF shown in FIG. 16A may be processed so that the stack pattern SP2 may be left on a portion of the bulk substrate 102 to form the EDMOS transistor TR2A including the SOI region 102A.

A relatively great distance between the gate electrode 250 and the second conductivity type drift region 132 may be maintained using the relatively thick buried insulation pattern 104 included in the stack pattern SP2 to reduce the vertical electric field in the gate electrode 250. The semiconductor body pattern 206 included in the stack pattern SP2 may be used as the field plate to increase the quantity of electrons drifting in the second conductivity type drift region 132, such that the current driving performance may be improved and the on-resistance may be reduced. Therefore, the electrical performance of the integrated circuit device may be improved.

While the present inventive concept has been shown and described with reference to example embodiments thereof, it will be understood by those of ordinary skill in the art that various changes in form and details may be made thereto without departing from the spirit and scope of the present inventive concept as set forth by the following claims.

What is claimed is:

1. An integrated circuit device comprising:
a bulk substrate;
a first conductivity type well and a second conductivity type drift region in the bulk substrate;
a stack pattern on the bulk substrate, wherein the stack pattern comprises a buried insulation pattern on the second conductivity type drift region and a semiconductor body pattern on the buried insulation pattern;
a gate insulation layer on an upper surface of the first conductivity type well and on a sidewall and an upper surface of the stack pattern;
a gate electrode on the gate insulation layer, wherein the gate electrode comprises a first gate portion opposite to the first conductivity type well with the gate insulation layer therebetween and a second gate portion opposite to the second conductivity type drift region with the gate insulation layer and the stack pattern therebetween;
a source region in the first conductivity type well;
a drain region in the second conductivity type drift region; and
an insulation spacer at least partially covering a sidewall of the stack pattern, adjacent to the drain region,
wherein the drain region in the second conductivity type drift region is at a location self-aligned with the insulation spacer.

2. The integrated circuit device according to claim 1, wherein the buried insulation pattern and the semiconductor body pattern have substantially similar planar shapes, respectively.

3. The integrated circuit device according to claim 1, further comprising an insulation spacer at least partially covering sidewalls of the gate electrode and sidewalls of the stack pattern,
wherein a first height of a first part of the insulation spacer at least partially covering a sidewall of the first gate portion is different from a second height of a second part of the insulation spacer at least partially covering a sidewall of the second gate portion.

4. The integrated circuit device according to claim 1, wherein the buried insulation pattern comprises a first local portion that is not covered by the gate electrode, wherein the semiconductor body pattern comprises a second local portion that is not covered by the gate electrode, and
wherein the first local portion and the second local portion are between the gate electrode and the drain region.

5. The integrated circuit device according to claim 4, further comprising:
a first insulation spacer at least partially covering sidewalls of the gate electrode; and
a second insulation spacer at least partially covering a sidewall of the stack pattern adjacent to the drain region,
wherein a part of the first insulation spacer at least partially covers the sidewall of the gate electrode on the semiconductor body pattern, and
wherein the second insulation spacer at least partially covers a sidewall of the semiconductor body pattern and is spaced apart from the part of the first insulation spacer.

6. The integrated circuit device according to claim 4, further comprising a metal silicide layer on the semiconductor body pattern,
wherein the metal silicide layer is remote from the gate electrode.

7. The integrated circuit device according to claim 1, wherein a first horizontal distance from the drain region to the gate electrode is greater than a second horizontal distance from the drain region to the stack pattern, and
wherein the semiconductor body pattern comprises a doped semiconductor material.

8. The integrated circuit device according to claim 1, wherein the insulation spacer is a first insulation spacer, further comprising:
a second insulation spacer at least partially covering a sidewall of the stack pattern, between the stack pattern and the drain region,
wherein the drain region is spaced apart from the insulation spacer.

9. The integrated circuit device according to claim 1, wherein the first conductivity type well and the second conductivity type drift region contact each other at an upper surface of the bulk substrate.

10. The integrated circuit device according to claim 1, wherein the first conductivity type well is spaced apart from the second conductivity type drift region.

11. An integrated circuit device comprising:
a substrate;
a first conductivity type well and a second conductivity type drift region in the substrate;
a buried insulation pattern on the second conductivity type drift region;
a semiconductor body pattern on the buried insulation pattern;
a gate insulation layer on the first conductivity type well and on the semiconductor body pattern, wherein the gate insulation layer comprises an extension portion at least partially covering a sidewall of the semiconductor body pattern;
a gate electrode on the gate insulation layer, wherein the gate electrode covers at least a portion of the first conductivity type well and at least a portion of the semiconductor body pattern and comprises a step corresponding to the extension portion of the gate insulation layer;
a source region in the first conductivity type well; and
a drain region in the second conductivity type drift region; and
an insulation spacer at least partially covering opposing sidewalls of the gate electrode,
wherein a first height of a first part of the insulation spacer at least partially covering a first one of the opposing sidewalls of the gate electrode is different from a second height of a second part of the insulation spacer at least partially covering a second one of the opposing sidewalls of the gate electrode.

12. The integrated circuit device according to claim 11, further comprising:
a field plate including a semiconductor body pattern on the buried insulation pattern;
wherein a first distance from the drain region to the gate electrode is greater than a second distance from the drain region to the field plate.

13. The integrated circuit device according to claim 11, wherein the gate electrode comprises a first gate portion that does not overlap the semiconductor body pattern, and a second gate portion that overlaps the semiconductor body pattern, and
wherein the first gate portion overlaps a portion of the second conductivity type drift region.

14. The integrated circuit device according to claim 11, wherein the semiconductor body pattern comprises doped silicon.

15. The integrated circuit device according to claim 11, further comprising:
a field plate including a semiconductor body pattern on the buried insulation pattern;
wherein the field plate comprises a metal silicide layer on a portion of the semiconductor body pattern that is not covered by the gate electrode.

16. An integrated circuit device comprising:
a bulk substrate including a first region and a second region that are laterally spaced apart from each other;
a buried insulation layer on the bulk substrate in the second region;
a semiconductor body on the buried insulation layer in the second region;
a first transistor including a first channel region in the bulk substrate in the first region; and
a second transistor including a second channel region in the semiconductor body in the second region,
wherein the first transistor comprises:
a first conductivity type well and a second conductivity type drift region in the bulk substrate in the first region;
a buried insulation pattern on the second conductivity type drift region;
a semiconductor body pattern on the buried insulation pattern;
a first gate electrode at least partially covering the first conductivity type well, the buried insulation pattern, and the semiconductor body pattern, and
wherein the buried insulation pattern is at the same level relative to the bulk substrate as the buried insulation layer, and
wherein the semiconductor body pattern is at the same level relative to the bulk substrate as the semiconductor body.

17. The integrated circuit device according to claim 16, wherein the first transistor further comprises:
a source region in the first conductivity type well;
a drain region in the second conductivity type drift region; and
a first gate insulation layer between the first gate electrode and the first conductivity type well and between the first gate electrode and the semiconductor body pattern, and
wherein the second transistor comprises:
a pair of source/drain regions in the semiconductor body;
a second gate insulation layer on the semiconductor body; and
a second gate electrode on the second gate insulation layer.

18. The integrated circuit device according to claim 17, wherein the first gate insulation layer and the second gate insulation layer have a same thickness.

19. The integrated circuit device according to claim 16, wherein the first transistor is a high voltage transistor, and the second transistor is a low voltage transistor.

* * * * *